United States Patent
Yanagida et al.

(10) Patent No.: US 10,659,704 B2
(45) Date of Patent: May 19, 2020

(54) IMAGING DEVICE

(71) Applicant: Panasonic Intellectual Property Management Co., Ltd., Osaka (JP)

(72) Inventors: Masaaki Yanagida, Kyoto (JP); Makoto Shouho, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/408,692

(22) Filed: May 10, 2019

(65) Prior Publication Data
US 2019/0364234 A1 Nov. 28, 2019

(30) Foreign Application Priority Data
May 24, 2018 (JP) ................................. 2018-099776

(51) Int. Cl.
H04N 5/359 (2011.01)
H04N 5/369 (2011.01)
H01L 27/146 (2006.01)

(52) U.S. Cl.
CPC ........... *H04N 5/359* (2013.01); *H04N 5/3698* (2013.01); *H01L 27/14643* (2013.01)

(58) Field of Classification Search
CPC ..................................................... H04N 5/359
USPC ....................................................... 348/308
See application file for complete search history.

(56) References Cited

U.S. PATENT DOCUMENTS

| 2007/0097240 | A1* | 5/2007 | Egawa | H04N 5/235 348/308 |
|---|---|---|---|---|
| 2008/0284891 | A1 | 11/2008 | Hattori | |
| 2009/0153715 | A1* | 6/2009 | Deschamps | H04N 5/35554 348/308 |
| 2009/0224140 | A1 | 9/2009 | Gomi | |

FOREIGN PATENT DOCUMENTS

| JP | 2008-017011 | 1/2008 |
|---|---|---|
| JP | 2008-042673 | 2/2008 |
| JP | 2008-042674 | 2/2008 |
| JP | 2008-288815 | 11/2008 |
| JP | 2009-218665 | 9/2009 |

* cited by examiner

*Primary Examiner* — Joel W Fosselman
(74) *Attorney, Agent, or Firm* — McDermott Will & Emery LLP

(57) ABSTRACT

There is provided an imaging device including: a pixel that outputs a pixel signal corresponding to an amount of incident light; an output signal line that is connected to the pixel to allow the pixel signal from the pixel to be output to the output signal line; a first transistor that has a first gate, a first source, and a first drain, one of the first source and the first drain being connected to the output signal line; and a first circuit that is connected to the first gate, the first circuit being configured to generate a third voltage that is a voltage between a first voltage and a second voltage, the first voltage being a voltage for turning on the first transistor, the second voltage being a voltage for turning off the first transistor.

16 Claims, 16 Drawing Sheets

IMAGING DEVICE

BACKGROUND

1. Technical Field

The present disclosure relates to an imaging device.

2. Description of the Related Art

There has been known an imaging device which scans and outputs, in succession, a reference signal at the time of resetting and a signal corresponding to the amount of received light. A true signal can be obtained by taking a difference between the reference signal and the signal corresponding to the amount of received light. This process is so-called correlated double sampling (CDS).

For example, when the sun is imaged, the sun high in luminous intensity is darker than surroundings in a picked-up image. This is generally called a blocked-up shadows phenomenon. A blocked-up shadows phenomenon occurs with high frequency in a state where a light-receiving surface of an imaging device is continuously exposed to high-intensity light.

To cope with the above-described phenomenon, Japanese Unexamined Patent Application Publication No. 2008-42674 discloses an imaging device which is provided with clipping transistors. Each clipping transistor has a function of clipping a potential of a signal at a pixel output line. One of a source and a drain of the clipping transistor is connected to the pixel output line while the other of the source and the drain of the clipping transistor is connected to a power supply voltage line. The use of clipping transistors makes it possible to prevent a potential at an output terminal of an operational amplifier from decreasing to below a fixed potential level when a reset signal is read. This allows inhibition of a blocked-up shadows phenomenon.

SUMMARY

There is a need to inhibit a blocked-up shadows phenomenon with a simple circuit configuration.

In one general aspect, the techniques disclosed here feature an imaging device including: a pixel that outputs a pixel signal corresponding to an amount of incident light; an output signal line that is connected to the pixel to allow the pixel signal from the pixel to be output to the output signal line; a first transistor that has a first gate, a first source, and a first drain, one of the first source and the first drain being connected to the output signal line; and a first circuit that is connected to the first gate, the first circuit being configured to generate a third voltage that is a voltage between a first voltage and a second voltage, the first voltage being a voltage for turning on the first transistor, the second voltage being a voltage for turning off the first transistor.

It should be noted that general or specific embodiments may be implemented as an element, a device, an apparatus, a system, an integrated circuit, a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
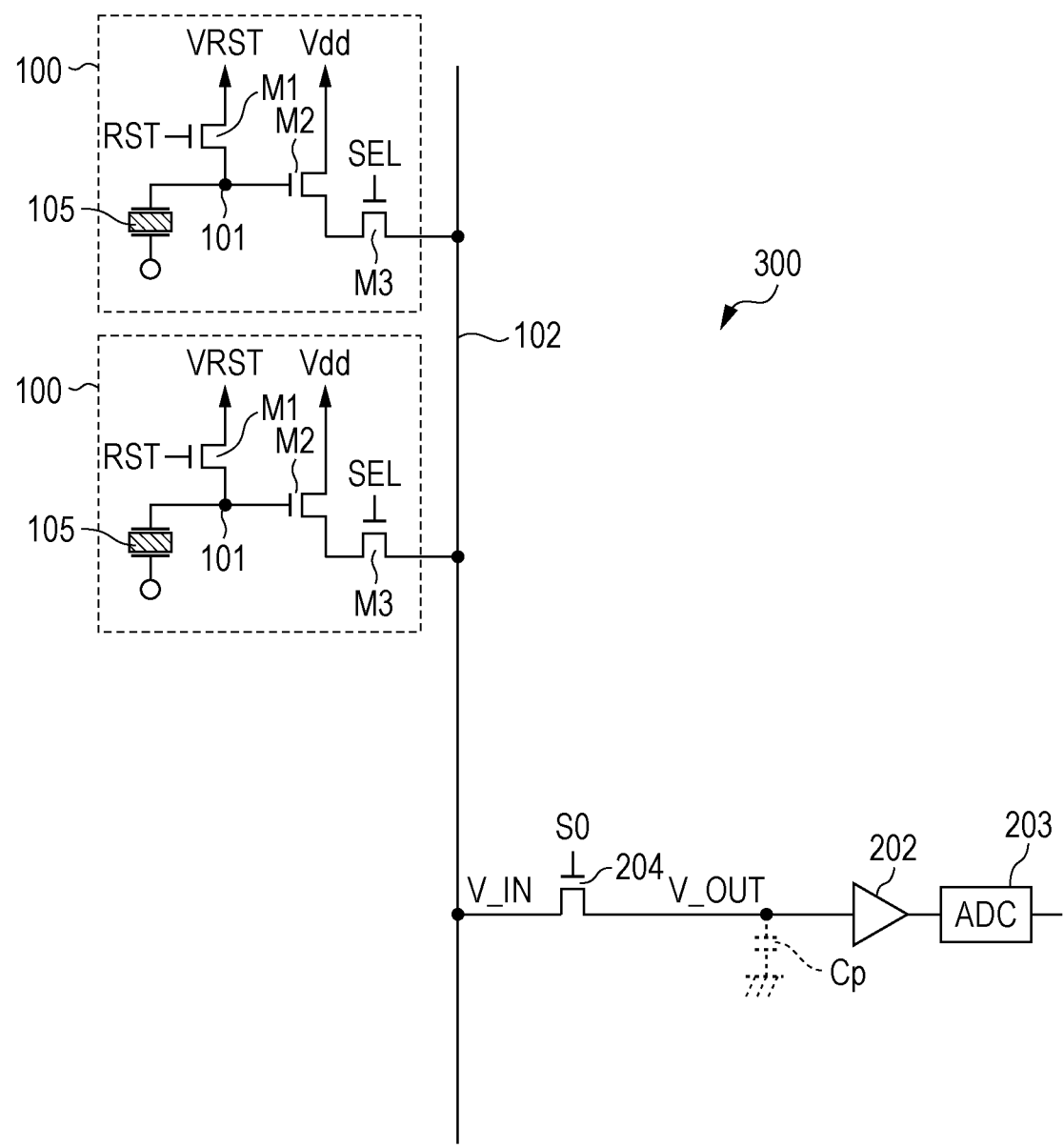
FIG. 1 is a diagram illustrating a circuit configuration of an imaging device according to a comparative example.

An overview of one aspect of the present disclosure is as described in the following items.

[Item 1]

An imaging device including:

a pixel that outputs a pixel signal corresponding to an amount of incident light;

an output signal line that is connected to the pixel to allow the pixel signal from the pixel to be output to the output signal line;

a first transistor that has a first gate, a first source, and a first drain, one of the first source and the first drain being connected to the output signal line; and a first circuit that is connected to the first gate, the first circuit being configured to generate a third voltage that is a voltage between a first voltage and a second voltage, the first voltage being a voltage for turning on the first transistor, the second voltage being a voltage for turning off the first transistor.

[Item 2]

The imaging device according to Item 1, further including: a second transistor that has a second gate, a second source, and a second drain, one of the second source and the second drain being connected to either the first source or the first drain, a fourth voltage being applied to the other of the second source and the second drain.

[Item 3]

The imaging device according to Item 1 or 2, in which the first circuit is configured to generate the first voltage, and the first circuit applies the first voltage to the first gate in a first period, and applies the third voltage to the first gate in a second period different from the first period.

[Item 4]

The imaging device according to Item 3, in which the pixel outputs the pixel signal to the output signal line in the first period, and outputs a reference signal after resetting to the output signal line in the second period.

[Item 5]

The imaging device according to Item 3 or 4, further including:

a third transistor that has a third gate, a third source, and a third drain, one of the third source and the third drain being connected to the one of the first source and the first drain, the other of the third source and the third drain being connected to the other of the first source and the first drain; and a second circuit that is connected to the third gate.

[Item 6]

The imaging device according to Item 5, in which the second circuit is configured to generate a fourth voltage for turning on the third transistor and a fifth voltage for turning off the third transistor, and the second circuit applies the fourth voltage to the third gate in the first period, and applies the fifth voltage to the third gate in the second period.

[Item 7]

The imaging device according to Item 5 or 6, in which the first transistor is an n-type transistor, and the third transistor is a p-type transistor.

[Item 8]

The imaging device according to Item 5 or 6, in which the first transistor is a p-type transistor, and the third transistor is an n-type transistor.

[Item 9]

The imaging device according to Item 5 or 6, in which a conductivity type of the first transistor is the same as a conductivity type of the third transistor.

[Item 10]

The imaging device according to Item 9, in which a gate width of the first transistor is less than a gate width of the third transistor.

[Item 11]

The imaging device according to any one of Items 3 to 10, in which the first voltage is a power supply voltage, and the second voltage is a ground voltage.

[Item 12]

The imaging device according to any one of Items 3 to 10, in which the first voltage is a ground voltage, and the second voltage is a power supply voltage.

[Item 13]

The imaging device according to Item 11 or 12, in which the third voltage is a voltage between the power supply voltage and the ground voltage.

[Item 14]

The imaging device according to any one of Items 3 to 10, in which the first voltage is greater than a power supply voltage, and the second voltage is a ground voltage.

[Item 15]

The imaging device according to any one of Items 3 to 10, in which the first voltage is less than a ground voltage, and the second voltage is a power supply voltage.

[Item 16]

The imaging device according to any one of Items 1 to 15, in which a width of a first input voltage range is less than a width of a second input voltage range, the first transistor indicating a linear input-output characteristic within the first input voltage range when the third voltage is applied to the first gate, the first transistor indicating a linear input-output characteristic within the second input voltage range when the first voltage is applied to the first gate.

An overview of another aspect of the present disclosure is as described below.

An imaging device according to the aspect of the present disclosure includes: a pixel which outputs a signal corresponding to incident light; an output signal line which is electrically connected to the pixel and to which the signal from the pixel is output; a first transistor which has a source and a drain, and in which one of the source and the drain is electrically connected to the output signal line; an output terminal which is electrically connected to the other of the source and the drain of the first transistor and to which the signal is output; and a first control circuit which applies a voltage having three different possible values to a gate of the first transistor.

The above-described configuration allows limitation of a voltage level of a signal output to the output terminal using the first transistor for controlling electrical continuity and discontinuity between the output signal line and the output terminal. Thus, appearance of blocked up shadows can be inhibited with a simple circuit configuration. The output terminal here means a terminal which is connected to the other of the source and the drain of the first transistor and to which the signal from the output signal line is output via the first transistor.

For example, the imaging device may include a second transistor which has a source and a drain, and in which one of the source and the drain is electrically connected to the one or the other of the source and the drain of the first transistor, and resets the other of the source and the drain of the first transistor.

The above-described configuration allows resetting of a voltage at the output terminal in a short time.

For example, the first control circuit may apply a first voltage for turning on the first transistor to the gate of the first transistor in a first period, and the first control circuit may apply a third voltage that is a voltage between the first voltage and a second voltage for turning off the first transistor to the gate of the first transistor in a second period different from the first period.

The above-described configuration allows limitation of a voltage level of a signal output to the output terminal by application of the voltage between the voltage for turning on the first transistor and the voltage for turning off the first transistor to the first transistor.

For example, the first period may be a period when a signal voltage is read, and the second period may be a period when a reset voltage is read.

The above-described configuration allows inhibition of appearance of blocked up shadows by limitation of a voltage level of the reset voltage.

For example, the imaging device may include a third transistor which has a source and a drain, and in which one of the source and the drain is connected to the one of the source and the drain of the first transistor and the other of the source and the drain is connected to the other of the source and the drain of the first transistor, and a second control circuit which applies a voltage to a gate of the third transistor.

The above-described configuration allows, for example, improvement of a signal transfer characteristic in a period when the output signal line and the output terminal are electrically continuous with each other.

For example, the second control circuit may apply a fourth voltage for turning on the third transistor to a gate of the second transistor in the first period, and the second control circuit may apply a fifth voltage for turning off the third transistor to the gate of the second transistor in the second period.

The above-described configuration allows improvement of a signal transfer characteristic in the first period and limitation of the voltage level in the second period.

For example, the first transistor may be an n-type transistor, and the third transistor may be a p-type transistor.

The above-described configuration allows improvement of the signal transfer characteristic in the first period and limitation of the voltage level in the second period in a pixel configuration which reads a positive hole as a signal charge.

For example, the first transistor may be a p-type transistor, and the third transistor may be an n-type transistor.

The above-described configuration allows improvement of the signal transfer characteristic in the first period and limitation of the voltage level in the second period in a pixel configuration which reads an electron as a signal charge.

For example, the first transistor and the third transistor may be identical in conductivity type.

The above-described configuration allows simplification of a circuit configuration.

For example, a gate width of the first transistor may be smaller than a gate width of the third transistor.

The above-described configuration allows simplification of the circuit configuration.

For example, the first voltage may be a power supply voltage, and the second voltage may be a ground voltage.

The above-described configuration allows improvement of the signal transfer characteristic in the first period and limitation of the voltage level in the second period in the pixel configuration that reads a positive hole as a signal charge.

For example, the first voltage may be a ground voltage, and the second voltage may be a power supply voltage.

The above-described configuration allows improvement of the signal transfer characteristic in the first period and limitation of the voltage level in the second period in the pixel configuration that reads an electron as a signal charge.

For example, the third voltage may be a voltage between the power supply voltage and the ground voltage.

The above-described configuration allows limitation of a voltage level of a signal output to the output terminal by application of the voltage between the power supply voltage and the ground voltage to the gate of the first transistor.

For example, the first voltage may be a voltage higher than a power supply voltage, and the second voltage may be a ground voltage.

The above-described configuration allows expansion of a voltage range for a signal which can be transmitted in the first period.

For example, the first voltage may be a voltage lower than a ground voltage, and the second voltage may be a power supply voltage.

The above-described configuration allows expansion of the voltage range for a signal which can be transmitted in the first period.

For example, the first control circuit may apply a first voltage to the gate of the first transistor in a first period, the first control circuit may apply a second voltage different from the first voltage to the gate of the first transistor in a second period different from the first period, the first transistor may output a linear voltage in response to an input voltage within an input voltage range of a third voltage to a fourth voltage (inclusive) in the first period, the first transistor may output a linear voltage in response to an input voltage within an input voltage range of a fifth voltage to a sixth voltage (inclusive) in the second period, and a difference between the third voltage and the fourth voltage may be larger than a difference between the fifth voltage and the sixth voltage.

The above-described configuration allows limitation of a voltage level of a signal output to the output terminal in the second period.

Embodiments of the present disclosure will be described below in detail with reference to the drawings. Note that any of the embodiments described below illustrates a comprehensive or specific example. Numerical values, shapes, materials, constituent elements, the arrangement and connection forms of the constituent elements, steps, the order of the steps, and the like illustrated in the embodiments below are merely illustrative, and are not intended to limit the present disclosure. Various aspects described in the present specification can be combined as long as there is no contradiction. Among the constituent elements in the embodiments below, those not described in an independent claim representing a top-level concept will be described as optional constituent elements. In the following description, constituent elements having substantially the same functions are denoted by the same reference characters, and a redundant description thereof may be omitted.

(Imaging Device of Comparative Example)

A configuration and operation of an imaging device according to a comparative example, to which a characteristic configuration (to be described later) of the present disclosure is not applied, will be described with reference to FIGS. 1, 2, 3, and 4 before describing an imaging device according to an embodiment.

(Structure of Imaging Device 300 of Comparative Example)

FIG. 1 is a diagram schematically illustrating an example of a circuit configuration of an imaging device 300 according to the comparative example.

The imaging device 300 includes a plurality of pixels 100 which are two-dimensionally arrayed and peripheral circuits. In practice, several millions of pixels 100 can be two-dimensionally arrayed. Only two pixels arranged in a certain column are illustrated in FIG. 1 for simplicity of the drawings. The imaging device 300 may be a line sensor. In this case, the plurality of pixels 100 are arrayed in one dimension, for example, in a row direction or a column direction.

Each pixel 100 outputs a signal corresponding to the amount of incident light. The peripheral circuits include, for example, a column amplifier 202, an AD conversion circuit 203 (i.e., analog-digital conversion circuit), and a row scanning circuit (not illustrated). The peripheral circuits mainly read pixel signals from the pixels 100 and process the read pixel signals, and output the processed pixel signals to outside the imaging device 300.

The pixel 100 and a first transistor 204 are electrically connected to each other via an output signal line 102 which is provided for each column. The column amplifier 202 outputs a reference signal and a pixel signal read from the pixel 100 to the AD conversion circuit 203.

The AD conversion circuit 203 calculates a true pixel signal by taking a difference between the reference signal and the pixel signal that are output from the column amplifier 202. The AD conversion circuit 203 generates a digital signal by performing AD conversion of the obtained true pixel signal. The imaging device 300 can output, for example, RAW data as a pixel signal.

Note that although an example which calculates a difference between a reference signal and a pixel signal before AD conversion is illustrated here, the AD conversion circuit 203 may perform AD-conversion of each of the reference signal and the pixel signal and calculate a difference between the reference signal and the pixel signal after the AD conversion.

The pixel 100 typically includes a photoelectric converter 105, a reset transistor M1, an amplification transistor M2, and a selection transistor M3.

The photoelectric converter 105 includes, for example, a photoelectric conversion film. The photoelectric converter 105 generates a signal charge through photoelectric conversion. The photoelectric converter 105 is electrically connected to the reset transistor M1 and the amplification transistor M2. A node which electrically connects the photoelectric converter 105, the reset transistor M1, and the amplification transistor M2 is generally called a floating diffusion node. In the present specification, a floating diffusion node may be called a FD node or a charge accumulation node. Signal charges obtained through photoelectric conversion by the photoelectric converter 105 are accumulated in a FD node 101.

The reset transistor M1 is electrically connected to the FD node 101. In FIG. 1, one of a source and a drain of the reset transistor M1 is connected to the FD node 101. The reset transistor M1 resets a potential at the FD node 101 to a reference potential VRST. The reset transistor M1 is controlled by a control signal RST which is input to a gate.

The amplification transistor M2 is electrically connected to the FD node 101. In FIG. 1, a gate of the amplification transistor M2 is connected to the FD node 101. The amplification transistor M2 amplifies and outputs a signal voltage which is generated in accordance with the amount of signal charges accumulated in the FD node 101.

The selection transistor M3 is electrically connected to the amplification transistor M2 and the output signal line 102. The amplification transistor M2 and the selection transistor M3 form a source follower circuit. The selection transistor M3 is controlled by a control signal SEL which is input to a gate. The selection transistor M3 selectively outputs an output signal from the amplification transistor M2 to the output signal line 102.

The first transistor 204 is a switch which selects whether to transfer an output signal from the output signal line 102 to column circuits (e.g., the column amplifier 202 and the AD conversion circuit 203).

An example where a signal charge is a positive hole will be described here. Note that an imaging device in which a signal charge is an electron also falls within the scope of the present disclosure.

(Description of Photoelectric Converter)

Figure 2:
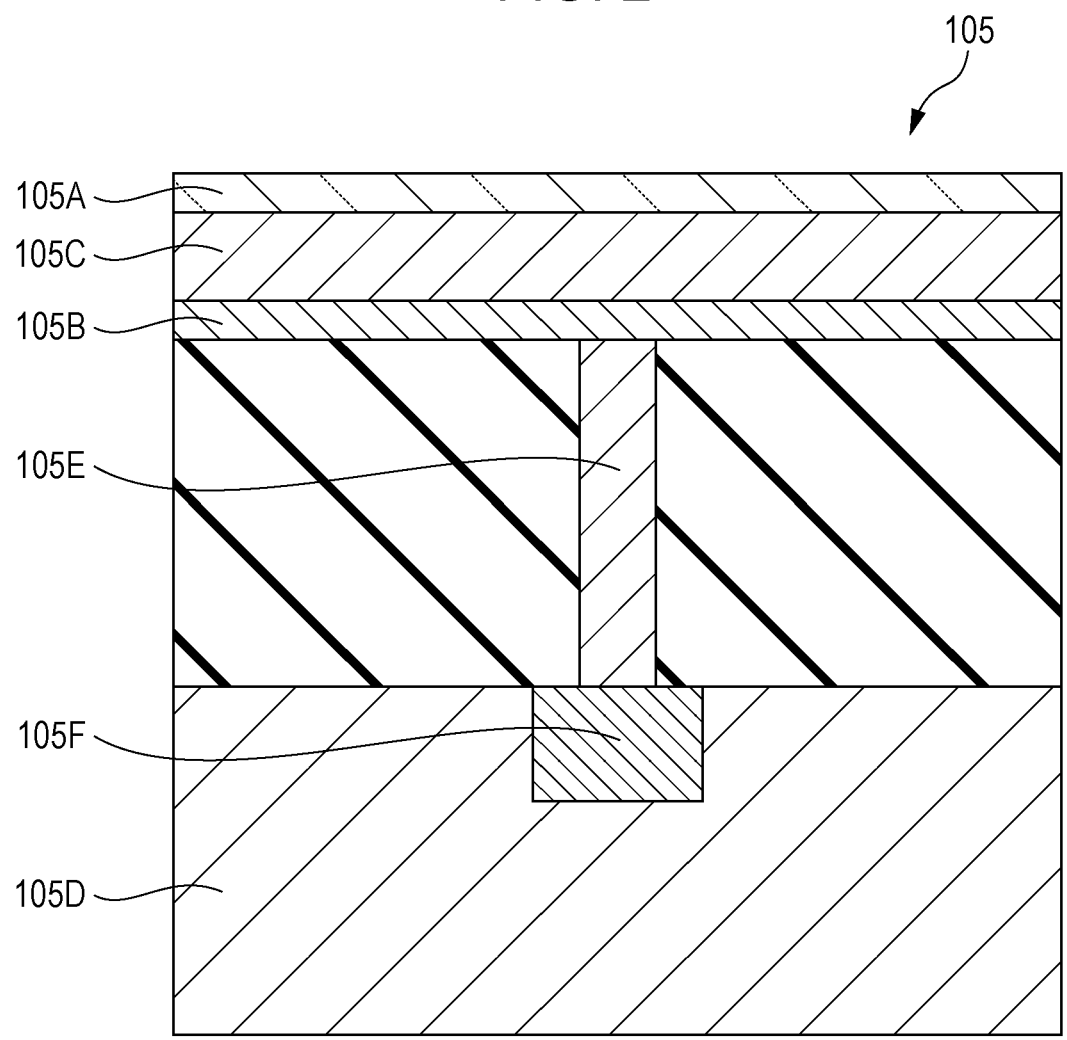
FIG. 2 is a cross-sectional view of a photoelectric converter.

FIG. 2 is a view schematically illustrating a cross-section taken along a normal direction of a semiconductor substrate 105D in the photoelectric converter 105 that is included in the pixel 100 illustrated in FIG. 1.

As illustrated in FIG. 2, the photoelectric converter 105 illustrated in FIG. 1 includes a transparent electrode 105A, a pixel electrode 105B, and a photoelectric conversion film 105C which is arranged between the transparent electrode 105A and the pixel electrode 105B. The transparent electrode 105A is electrically connected to a control circuit (not illustrated) which controls a potential at the transparent electrode 105A. A diffusion region 105F is provided in the semiconductor substrate 105D and is electrically connected to the pixel electrode 105B via a contact plug 105E. The pixel electrode 105B, the contact plug 105E, and the diffusion region 105F are included in the FD node 101 described earlier. In the present disclosure, the photoelectric converter 105 may be a photodiode and may be configured to include the photoelectric conversion film 105C as illustrated in FIG. 2.

In the imaging device 300 illustrated in FIG. 1, charges are collected in the manner below. When light enters the photoelectric conversion film 105C from the transparent electrode 105A side, positive and negative charges are generated by photoelectric conversion. If a voltage is applied between the transparent electrode 105A and the pixel electrode 105B at this time, an electric field is produced. As a result, one of the positive charges and the negative charges is collected by the pixel electrode 105B. For example, the pixel electrode 105B is reset to the reference potential VRST, and a voltage VITO is applied to the transparent electrode 105A. In this case, if VITO>VRST>0, positive charges are collected by the pixel electrode 105B. At this time, the voltage VITO is, for example, 10 V and that the reference potential VRST is, for example, 1 V. If VITO<VRST, negative charges are collected by the pixel electrode 105B and are accumulated in the FD node 101.

(Operation of Imaging Device 300)

An operation at the time of imaging of a subject with a normal level of brightness will be described first.

Figure 3:
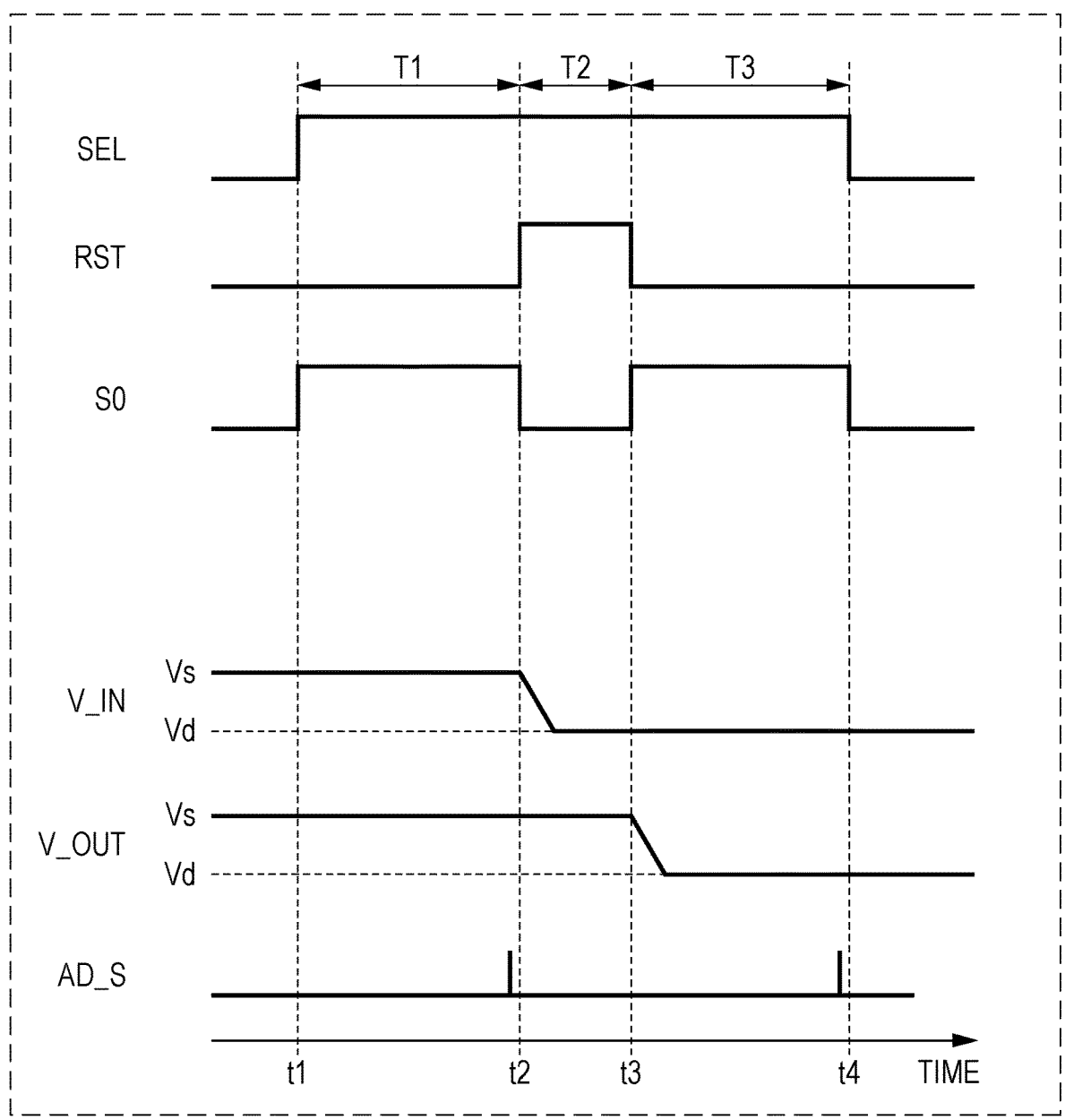
FIG. 3 is a chart illustrating operation timing at the time of imaging of a subject with a normal level of brightness by the imaging device according to the comparative example.

FIG. 3 is a chart illustrating an example of operation timing at the time of imaging of a subject with a normal level of brightness. FIG. 3 illustrates waveforms of the control signal SEL, the control signal RST, a voltage V_IN which is output to the output signal line 102, a voltage V_OUT which is output from the first transistor 204, a control signal S0 for the first transistor 204, and a sampling signal AD_S which is used in the AD conversion circuit 203.

(Pixel Signal Read Period T1)

In a pixel signal read period T1, a signal voltage Vs indicating a pixel signal is read. More specifically, at a time t1, the control signal SEL changes to high level to turn on the selection transistor M3. In this manner, the pixel 100 to be read is selected on a per-column basis, and reading of a pixel signal from the selected pixel 100 is started. More specifically, the source follower circuit described above outputs a pixel signal corresponding to the amount of signal charges accumulated in the FD node 101 to the output signal line 102.

Let Gsf be a gain of the source follower circuit. A voltage at the output signal line 102 is the signal voltage Vs represented by Expression (1). In Expression (1), VRST is a reference potential at the time of resetting, ΔVPC is a pixel signal voltage corresponding to the amount of charges generated by photoelectric conversion, and Vth0 is a threshold voltage of the amplification transistor M2.

$$Vs=Gsf\times(VRST+\Delta VPC-Vth0) \quad (1)$$

At the time t1, the control signal S0 is set to high level to turn on the first transistor 204. Thus, in the pixel signal read period T1, the signal voltage Vs is transmitted from the output signal line 102 to the AD conversion circuit 203 via the first transistor 204 and the column amplifier 202. That is, in the pixel signal read period T1, the voltages V_IN and V_OUT are both the signal voltage Vs.

(Reset Period T2)

At a time t2, the control signal RST changes to high level to turn on the reset transistor M1. This resets the potential at the FD node 101 to the reference potential VRST. The control signal S0 is at low level, and the first transistor 204 is off. That is, in a reset period T2, the voltage V_IN decreases to a reference voltage Vd (to be described later). The voltage V_OUT is kept at the signal voltage Vs.

(Reference Signal Read Period T3)

In a reference signal read period T3, the reference voltage Vd indicating a reference signal is read. The reference voltage Vd is also called a dark voltage or a reset voltage. More specifically, at a time t3, the control signal RST is set to low level to turn off the reset transistor M1. The voltage at the output signal line 102 at this time is the reference voltage Vd represented by Expression (2):

$$Vd=Gsf\times(VRST-Vth0) \quad (2)$$

At the time t3, the control signal S0 is set to high level to turn on the first transistor 204. Thus, the reference voltage Vd is transmitted from the output signal line 102 to the AD conversion circuit 203 via the first transistor 204 and the column amplifier 202. That is, in the reference signal read period T3, the voltages V_IN and V_OUT are both the reference voltage Vd.

The imaging device 300 then calculates a difference between the signal voltage Vs output in the pixel signal read period T1 and the reference voltage Vd output in the reference signal read period T3. With this calculation, a differential voltage Vpix indicating a true pixel signal is obtained. The differential voltage Vpix is represented by Expression (3):

$$Vpix=Vs-Vd=Gsf\times(VRST+\Delta VPC-Vth0)-Gsf\times(VRST-Vth0)=Gsf\times\Delta VPC \quad (3)$$

The AD conversion circuit 203 performs AD-conversion of the differential voltage Vpix.

Figure 4:
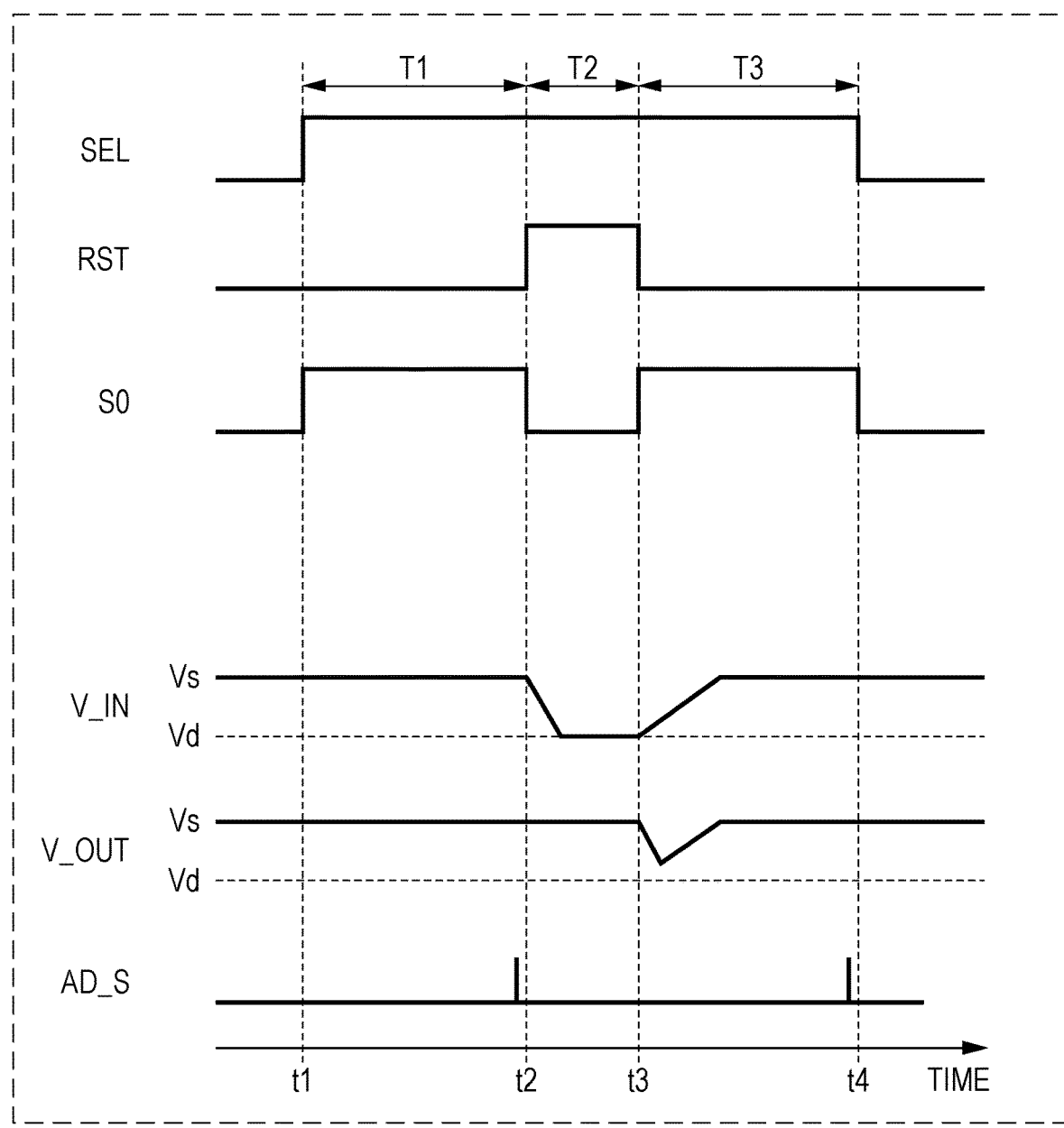
FIG. 4 is a chart illustrating operation timing at the time of imaging of a high-brightness subject by the imaging device according to the comparative example.

An operation at the time of imaging of a high-brightness subject which may cause appearance of blocked up shadows will be described. FIG. 4 is a chart illustrating an example of operation timing at the time of imaging of a high-brightness subject.

(Pixel Signal Read Period T1)

An operation in the period T1 is the same as the operation at the time of imaging of a subject with a normal level of brightness. Note that, when the high-brightness subject is imaged, the FD node 101 is saturated with charges generated through photoelectric conversion. For this reason, a pixel signal voltage corresponding to the amount of charges accumulated in the FD node 101 is also saturated. The saturated pixel signal voltage is denoted by ΔVPC_MAX. If ΔVPC_MAX is substituted for ΔVPC in Expression (1), Expression (4) is obtained.

$$Vs=Gsf\times(VRST+\Delta VPC\_MAX-Vth0) \quad (4)$$

(Reset Period T2)

As in FIG. 3, at the time t2, the control signal RST changes to high level to turn on the reset transistor M1. This resets the potential at the FD node 101 to the reference potential VRST.

(Reference Signal Read Period T3)

At the time t3, the control signal RST changes to low level to turn off the reset transistor M1. At the time of imaging of the high-brightness subject, many signal charges are generated by photoelectric conversion in a period from the time t3 to a time t4 as well. For this reason, the potential at the FD node 101 rises sharply. With this rise, the voltages V_IN and V_OUT also rise. The voltages V_IN and V_OUT can reach the same level as the signal voltage Vs at most.

In the above-described state, the reference voltage Vd represented by Expression (5) at most is output to the output signal line 102.

$$Vd=Gsf\times(VRST+\Delta VPC\_MAX-Vth0) \quad (5)$$

If the reference voltage Vd represented by Expression (5) is output, the difference between the reference voltage Vd and the signal voltage Vs is zero. That is, the differential voltage Vpix indicating a true pixel signal is zero, and a point corresponding to the pixel 100 in an image indicates a black color. For this reason, when a high-brightness subject is imaged, blocked up shadows appear.

Note that although an example which calculates a difference between a reference signal and a pixel signal before AD conversion is illustrated here, the AD conversion circuit 203 may perform AD conversion of each of the reference signal and the pixel signal and calculate the difference between the reference signal and the pixel signal after the AD conversion.

In the above-described case, at a time when the sampling signal AD_S illustrated in FIGS. 3 and 4 changes to high level, the AD conversion circuit 203 samples a voltage at an output terminal 214 and performs AD conversion of each sample. That is, the AD conversion circuit 203 performs AD conversion of the signal voltage Vs immediately before the time t2. The AD conversion circuit 203 performs AD conversion of the reference voltage Vd immediately before the time t4.

First Embodiment

A structure and operation of an imaging device 200 according to the present embodiment will be described with reference to FIGS. 5 to 7.

(Structure of Imaging Device 200)

Figure 5:
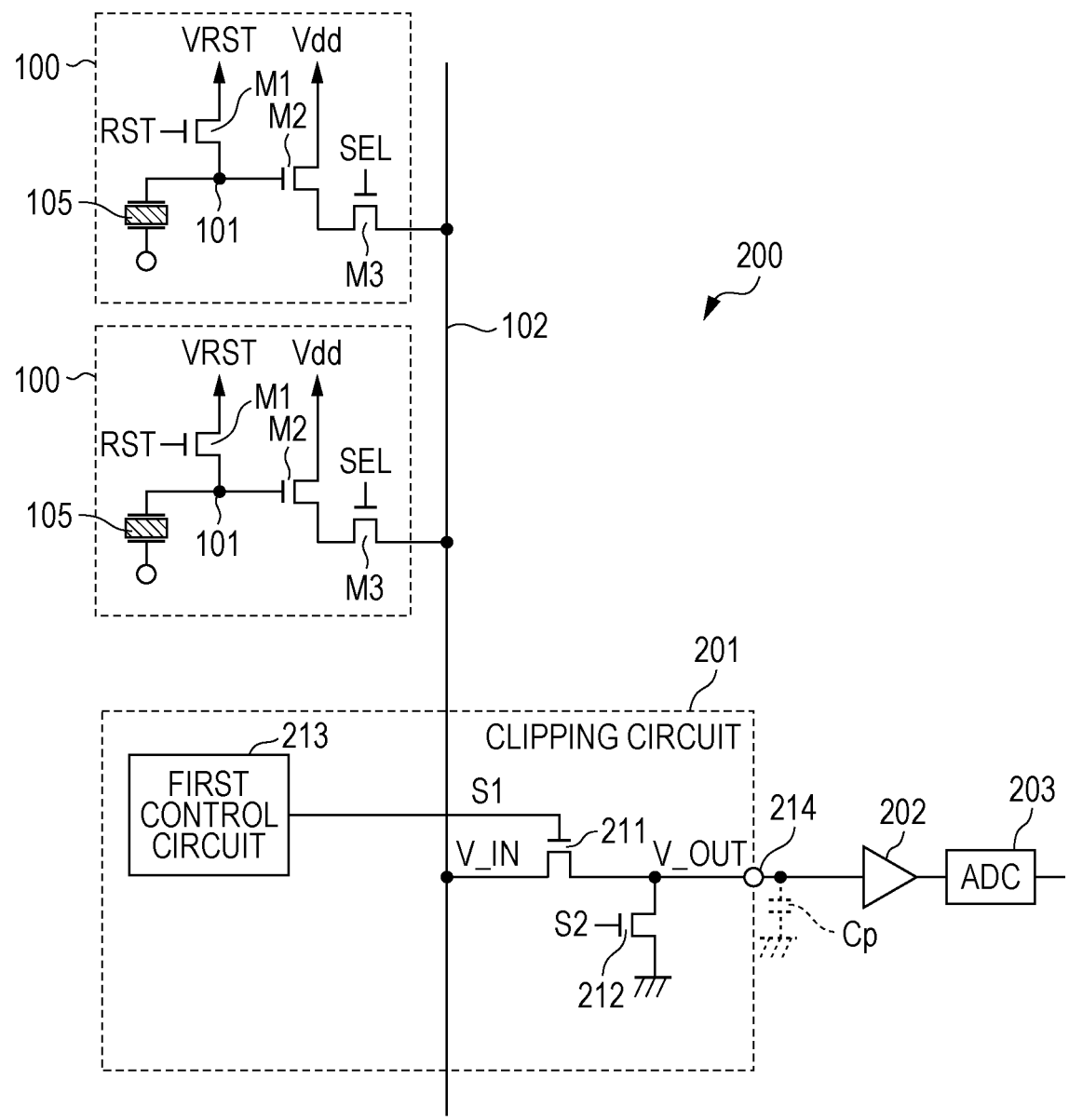
FIG. 5 is a diagram illustrating a circuit configuration of an imaging device according to a first embodiment.

FIG. 5 is a diagram schematically illustrating an example of a circuit configuration of the imaging device 200 according to the present embodiment. The imaging device 200 includes a plurality of pixels 100 which are two-dimensionally arrayed and peripheral circuits. Note that a configuration of each pixel 100 is the same as that of the pixel 100 in the imaging device 300 illustrated in FIG. 1 and that a detailed description thereof will be omitted.

The peripheral circuits include a clipping circuit 201, a column amplifier 202, an AD conversion circuit 203, and a row scanning circuit (not illustrated). Note that components other than the clipping circuit 201 are the same as those in the imaging device 300 illustrated in FIG. 1 and that a description thereof will be omitted. The peripheral circuits mainly read pixel signals from the pixels 100 and process the read pixel signals, and output the processed pixel signals to outside the imaging device 200.

The pixel 100 and the clipping circuit 201 are electrically connected to each other via an output signal line 102 which is provided for each column. The clipping circuit 201 outputs, to an output terminal 214, a reference signal and a pixel signal output to the output signal line 102. More specifically, the clipping circuit 201 has a mode of outputting a signal from the output signal line 102 to the output terminal 214 without any processing, a mode of making the output signal line 102 and the output terminal 214 electrically discontinuous with each other, and a mode of limiting a voltage value of a signal from the output signal line 102 and outputting the signal to the output terminal 214.

The clipping circuit 201 includes a first transistor 211, a reset switch 212, a first control circuit 213, and the output terminal 214. A parasitic capacitance Cp is connected to the output terminal 214.

The first transistor 211 is controlled by a control signal S1 and outputs an input voltage V_IN as an output voltage V_OUT. More specifically, the control signal S1 is applied to a gate of the first transistor 211, one of a source and a drain is connected to the output signal line 102, and the other of the source and the drain is connected to the output terminal 214. Note that, hereinafter, a node on the output signal line 102 side of the first transistor 211 will be called a V_IN node; and a node on the output terminal 214 side, a V_OUT node.

The output terminal 214 is connected to an input terminal of the column amplifier 202. That is, a signal output from each pixel 100 is output to a downstream processing circuit via the output terminal 214. Here, the downstream processing circuit is the column amplifier 202, for example. Note that components downstream of the output terminal 214 are merely illustrative, the present disclosure is not limited to the components, and that the clipping circuit 201 according to the present disclosure can be applied to any known imaging device.

The reset switch 212 is connected to the V_OUT node. The reset switch 212 is also called a second transistor. The reset switch 212 may be connected to the V_IN node. An on-off state of the reset switch 212 is controlled by a control signal S2. Turn-on of the reset switch 212 releases charges accumulated in the parasitic capacitance Cp for the V_OUT node and resets the V_OUT node to a fixed potential. More specifically, the control signal S2 is applied to a gate of the reset switch 212, one of a source and a drain is connected to the output terminal 214, and the fixed potential (e.g., a ground voltage) is applied to the other of the source and the drain. With turn-on of the reset switch 212, charges accumulated in the parasitic capacitance Cp can be released in a short time even if, for example, an intermediate voltage is applied to the gate of the first transistor 211. Note that the fixed potential to be applied to the other of the source and the drain of the reset switch 212 may be, for example, a reference potential VRST or a potential close to the reference potential VRST. This allows reduction in the time required to charge or discharge the parasitic capacitance Cp.

The first control circuit 213 generates the ternary control signal S1 that controls the first transistor 211. Note that various signals other than the control signal S1 are generated by, for example, a control circuit (not illustrated) which the imaging device 200 includes.

The first embodiment describes an example where a signal charge is a positive hole. Note that an imaging device in which a signal charge is an electron also falls within the scope of the present disclosure.

(Operation of Imaging device 200)

An operation at the time of imaging of a subject with a normal level of brightness is the same as that in the imaging device 300. An operation at the time of imaging of a high-brightness subject which may cause appearance of blocked up shadows will be described below.

Figure 6:
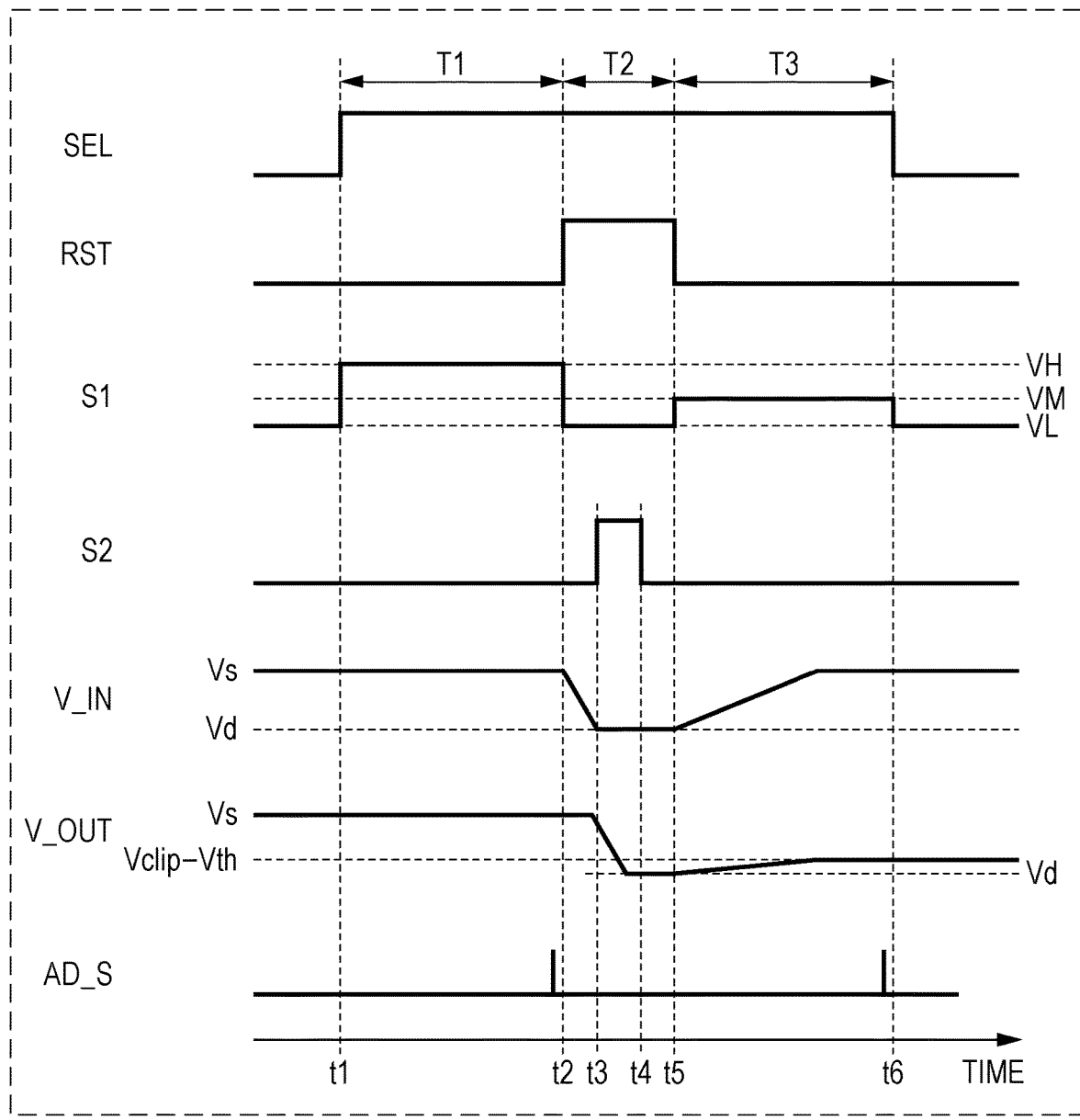
FIG. 6 is a chart illustrating operation timing of the imaging device according to the first embodiment.
Figure 7:
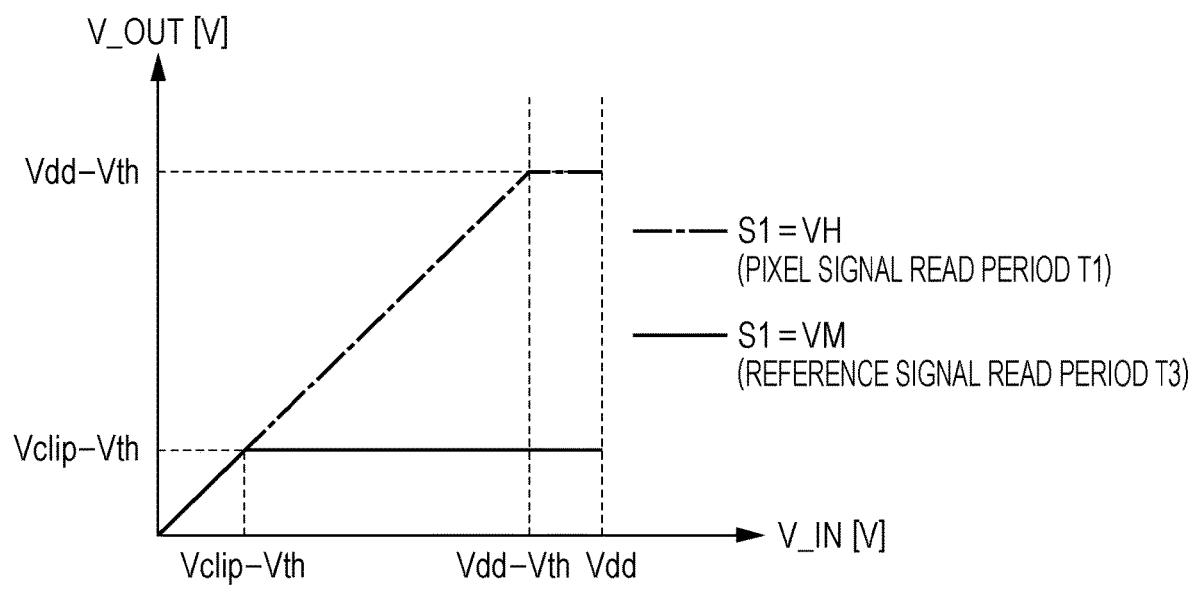
FIG. 7 is a graph illustrating an input-output characteristic of a clipping circuit according to the first embodiment when VH=Vdd.

FIG. 6 is a chart illustrating an example of operation timing at the time of imaging of a high-brightness subject. FIG. 6 illustrates waveforms of a control signal SEL, a control signal RST, the voltage V_IN which is output to the output signal line 102, the voltage V_OUT which is output from the first transistor 211, the control signal S1 for the first transistor 211, the control signal S2 for the reset switch 212, and a sampling signal AD_S in the AD conversion circuit 203.

(Pixel Signal Read Period T1)

As in the imaging device 300 according to the comparative example described earlier, a voltage (i.e., signal voltage Vs) at the output signal line 102 is indicated by Expression (4). At a time t1, the control signal S1 changes to high level (VH) to turn on the first transistor 211. The voltage VH is set at, for example, a power supply voltage Vdd. With this turn-on, the signal voltage Vs is input to the AD conversion circuit 203 via the output terminal 214 and the column amplifier 202.

(Reset Period T2)

As in the imaging device 300 according to the comparative example described earlier, at a time t2, the control signal RST changes to high level to turn on a reset transistor M1. This resets a potential at a FD node 101 to the reference potential VRST.

At the time t2, the control signal S1 changes to low level (VL) to turn off the first transistor 211. The voltage VL is set at, for example, the ground voltage (GND voltage). At a time t3, the control signal S2 changes to high level, charges accumulated in the parasitic capacitance Cp for the V_OUT node are released, and the V_OUT node is reset to the fixed potential. In the example illustrated in FIG. 5, the V_OUT node is reset to the ground voltage. After that, at a time t4, the control signal S2 changes to low level to turn off the reset switch 212.

(Reference Signal Read Period T3)

At a time t5, the control signal RST changes to low level to turn off the reset transistor M1. Additionally, the control signal S1 changes to intermediate voltage level (VM). The voltage VM is set at, for example, a voltage intermediate between the power supply voltage Vdd and the ground voltage (GND voltage). This clips the output voltage V_OUT to not more than the input voltage V_IN.

The principle of the clipping operation will be described with reference to FIG. 7. FIG. 7 is a graph indicating an input-output characteristic of the first transistor 211. The abscissa in FIG. 7 indicates the input voltage V_IN while the ordinate indicates the output voltage V_OUT. The alternate long and short dash line indicates an input-output characteristic of the first transistor 211 when the control signal S1 is at high level (VH). The solid line indicates an input-output characteristic of the first transistor 211 when the control signal S1 is at intermediate level (VM). By way of example, a graph when VH=Vdd, and 0<VM=Vclip<Vdd are satisfied is illustrated here.

If the control signal S1 is at VH, the input-output characteristic varies linearly within the range $0 \leq V\_IN \leq Vdd-$ Vth. Vth here denotes a threshold voltage of the first transistor 211. More specifically, V_OUT=V_IN holds within the range 0≤V_IN≤Vdd−Vth while V_OUT=Vdd−Vth holds within the range Vdd−Vth<V_IN.

If the control signal S1 is at VM, the input-output characteristic varies linearly within the range 0≤V_IN≤Vclip−Vth. More specifically, V_OUT=V_IN holds within the range 0≤V_IN≤Vclip−Vth while V_OUT=Vclip−Vth holds within the range Vclip−Vth<V_IN.

That is, if the control signal S1 applied to the gate of the first transistor 211 is at VM, a range for the input voltage V_IN, within which the clipping circuit 201 can produce linear output, is narrower than in the case where the control signal S1 is at VH. In other words, the first transistor 211 indicates a linear input-output characteristic within the input voltage range of 0 to Vdd−Vth (inclusive) in a first period when a first voltage (VH) is applied to the gate. Additionally, the first transistor 211 indicates a linear input-output characteristic within the input voltage range of 0 to Vclip−Vth (inclusive) in a second period when a third voltage (VM) is applied to the gate. An input voltage range within which the first transistor 211 indicates a linear input-output characteristic in the second period is narrower than an input voltage range within which the first transistor 211 indicates a linear input-output characteristic in the first period.

The signal voltage Vs output to the output signal line 102 varies within the range of 0 to Vdd in accordance with the amount of light. At the time of imaging of a subject with a normal level of brightness, a reference voltage Vd is indicated by Expression (2) described above. At the time of imaging of a high-brightness subject, the reference voltage Vd is indicated by Expression (6) below regardless of the amount of light.

$$Vd=Vclip-Vth \qquad (6)$$

That is, the clipping circuit 201 may output the reference voltage Vd at the time of reference voltage reading and may be unable to output a voltage higher than the reference voltage Vd.

In terms of inhibiting a blocked-up shadows phenomenon at the time of imaging of a high-brightness subject, it is desirable to limit a range within which the clipping circuit 201 can produce linear output in the read period T3 for the reference voltage Vd. In the present embodiment, a range for a voltage which can be output by the first transistor 211 can be made different between the pixel signal read period T1 and the reference signal read period T3 by varying the control signal S1. It is thus possible to inhibit a blocked-up shadows phenomenon without newly adding a transistor for clipping and the like to the configuration illustrated in FIG. 1. As described above, the imaging device 200 according to the present embodiment can inhibit appearance of blocked up shadows with a simple circuit configuration.

More specifically, as in the case in FIG. 4, the voltage V_IN rises due to effects of the high-brightness subject in a period from the time t5 to a time t6. However, since the control signal S1 is at the intermediate voltage VM, the output voltage V_OUT from the first transistor 211 is clipped to Vclip−Vth.

The imaging device 200 takes a difference between the signal voltage Vs and the reference voltage Vd. With this operation, a differential voltage Vpix is obtained. As seen from Expressions (4) and (6), the differential voltage Vpix is represented by Expression (7):

$$Vpix=Vs-Vd=Gsf\times(VRST+\Delta VPC\_MAX-Vth0)-(Vclip-Vth) \qquad (7)$$

Here, (Vclip−Vth) is smaller than Gsf×(VRST+ΔVPC_MAX−Vth0). Thus, Vpix takes a value larger than zero. This reduces blocked up shadows in the imaging device 200.

Figure 8:
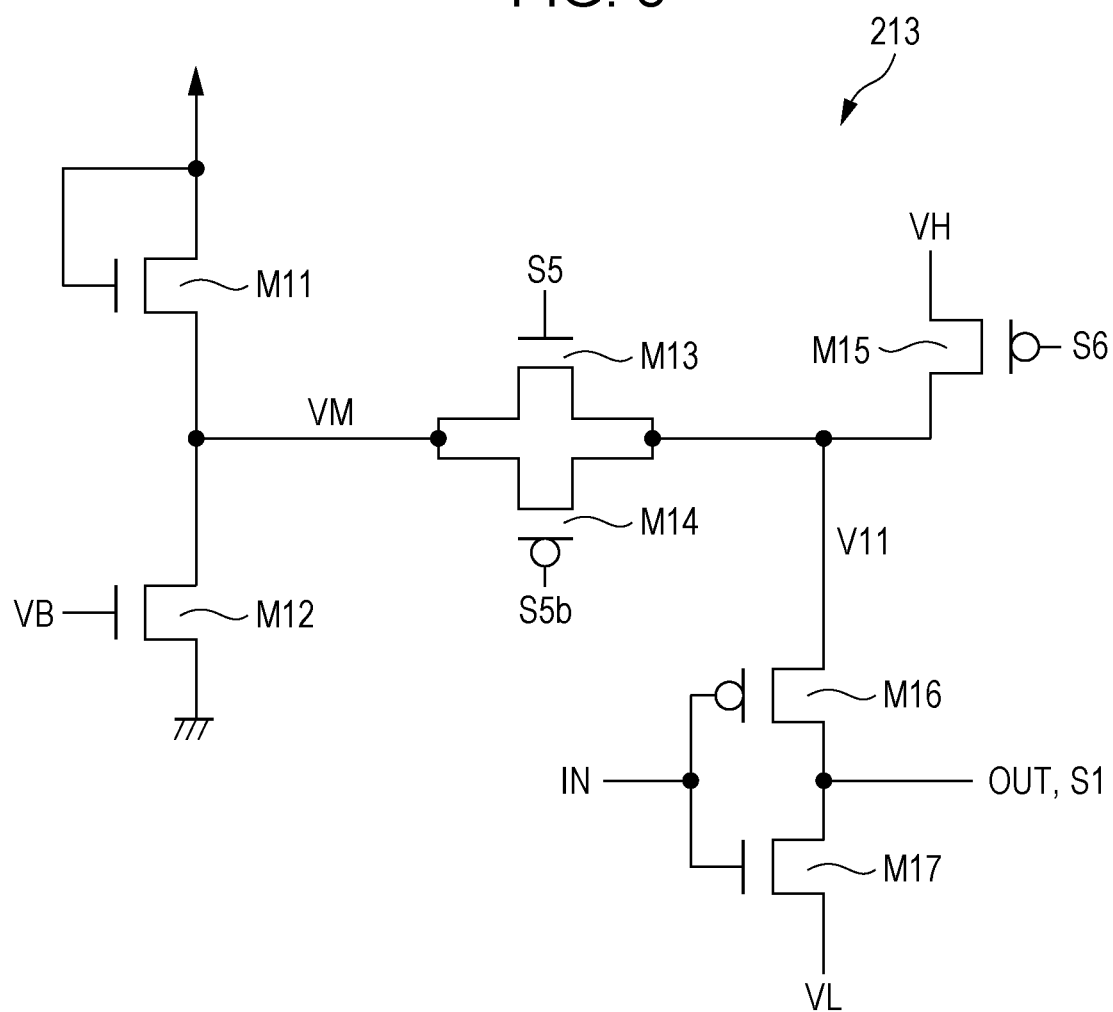
FIG. 8 is a diagram illustrating an example of a circuit configuration of a first control circuit according to the first embodiment.

FIG. 8 is a diagram illustrating an example of the first control circuit 213. The first control circuit 213 includes transistors M11 to M17. A gate and a drain of the transistor M11 are connected. The power supply voltage is applied to the gate and the drain of the transistor M11. A voltage VB is applied to a gate of the transistor M12, the ground voltage is applied to a source, and a drain is connected to a source of the transistor M11. Note that a connection point between the transistor M11 and the transistor M12 is also called a VM node.

A signal S5 is applied to a gate of the transistor M13, one of a source and a drain is connected to the VM node, and the other of the source and the drain is connected to a V11 node. A signal S5b is applied to a gate of the transistor M14, one of a source and a drain is connected to the VM node, and the other of the source and the drain is connected to the V11 node.

A signal S6 is applied to a gate of the transistor M15, the voltage VH is applied to a source, and a drain is connected to the V11 node. A gate of the transistor M16 is connected to a pulse input terminal IN, a source is connected to the V11 node, and a drain is connected to an output terminal OUT. A gate of the transistor M17 is connected to the pulse input terminal IN, the voltage VL is applied to a source, and a drain is connected to the output terminal OUT.

Note that the transistors M14, M15, and M16 may be, for example, PMOS transistors and that the other transistors may be NMOS transistors.

By switching a signal from the pulse input terminal IN, the voltage VL or a voltage V11 is output to the output terminal OUT. The transistors M11 and M12 constitute a source follower circuit. The source follower circuit generates the intermediate voltage VM. Additionally, change of the gate voltage VB for the transistor M12 allows change of the intermediate voltage VM. One of the intermediate voltage VM and the voltage VH is output as the voltage V11 in accordance with the combination of the signals S5 and S6. Note that the signal S5b is an inverted signal of the signal S5.

With the above-described configuration, the first control circuit 213 can output a voltage with three possible values, VL, VM, and VH.

Note that although an example where VH=Vdd has been illustrated above, the voltage VH may be a voltage higher than the power supply voltage Vdd. This allows expansion of an output voltage range for the clipping circuit 201 in the pixel signal read period T1. More specifically, the clipping circuit 201 can output a voltage higher than Vdd−Vth. For example, if VH=Vdd+Vth, the input-output characteristic of the first transistor 211 is the same as in FIG. 13 (to be described later).

Note that although an example which calculates a difference between a reference signal and a pixel signal before AD conversion is illustrated here, the AD conversion circuit 203 may perform AD conversion of each of the reference signal and the pixel signal and calculate a difference between the reference signal and the pixel signal after the AD conversion.

In the above-described case, at a time when the sampling signal AD_S illustrated in FIG. 6 changes to high level, the AD conversion circuit 203 samples a voltage at the output terminal 214 and performs AD conversion of each sample. That is, the AD conversion circuit 203 performs AD conversion of the signal voltage Vs immediately before the time t2. The AD conversion circuit 203 performs AD conversion immediately before the time t6.

(Modification of First Embodiment)

Figure 9:
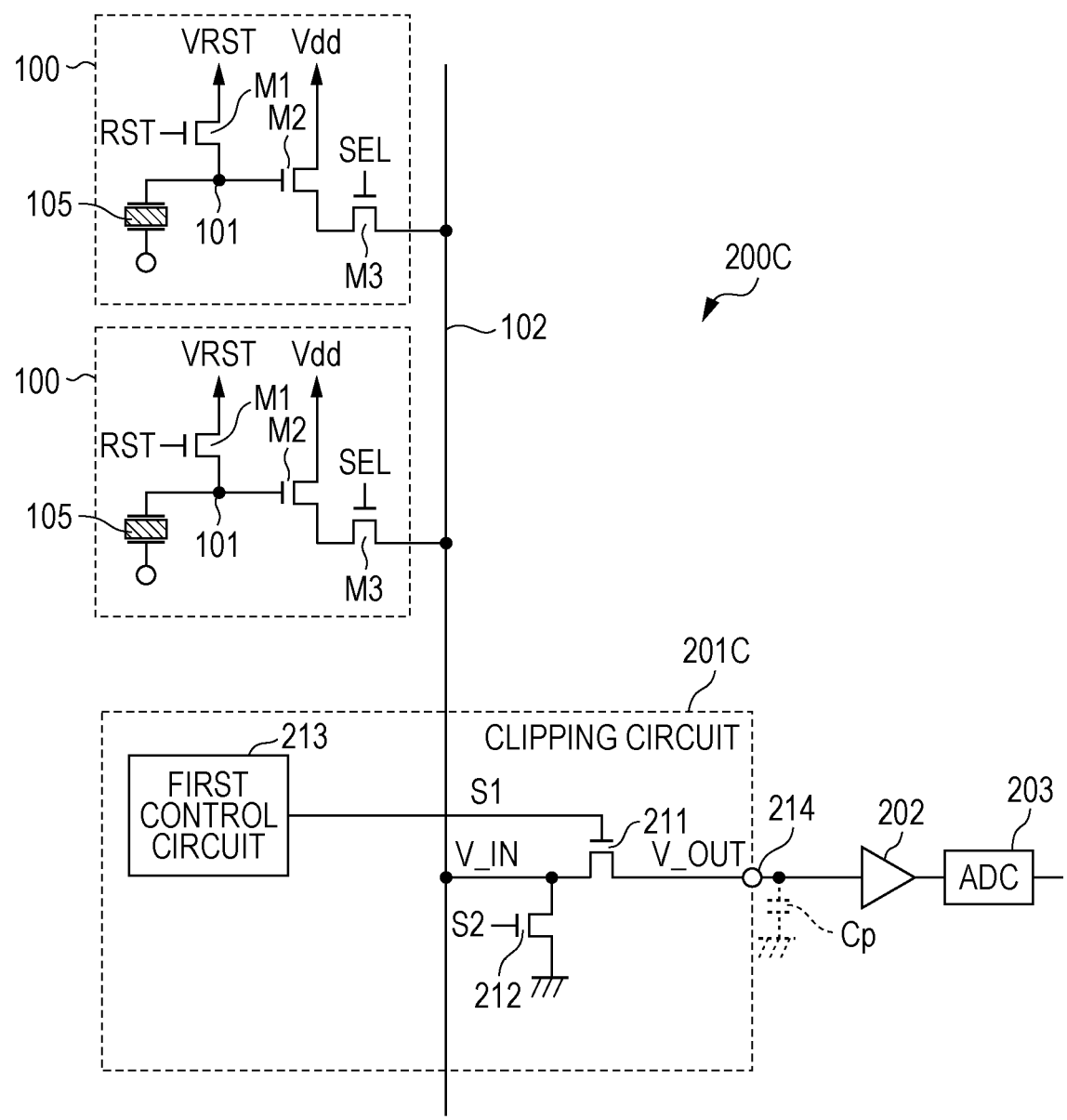
FIG. 9 is a diagram illustrating a circuit configuration of an imaging device according to a modification of the first embodiment.

FIG. 9 is a diagram illustrating a configuration of an imaging device 200C according to a modification of the first embodiment. The imaging device 200C illustrated in FIG. 9 is different from the imaging device 200 illustrated in FIG. 5 in a position where the reset switch 212 is connected. More specifically, in a clipping circuit 201C, one of a source and a drain of the reset switch 212 is connected to one of a source and a drain of the first transistor 211 which is connected to the output signal line 102, and a fixed potential (e.g., a ground voltage) is applied to the other of the source and the drain. Note that the fixed potential applied to the other of the source and the drain of the reset switch 212 may be, for example, the reference potential VRST or a potential close to the reference potential VRST. This allows reduction in the time required to charge or discharge the parasitic capacitance Cp.

Figure 10:
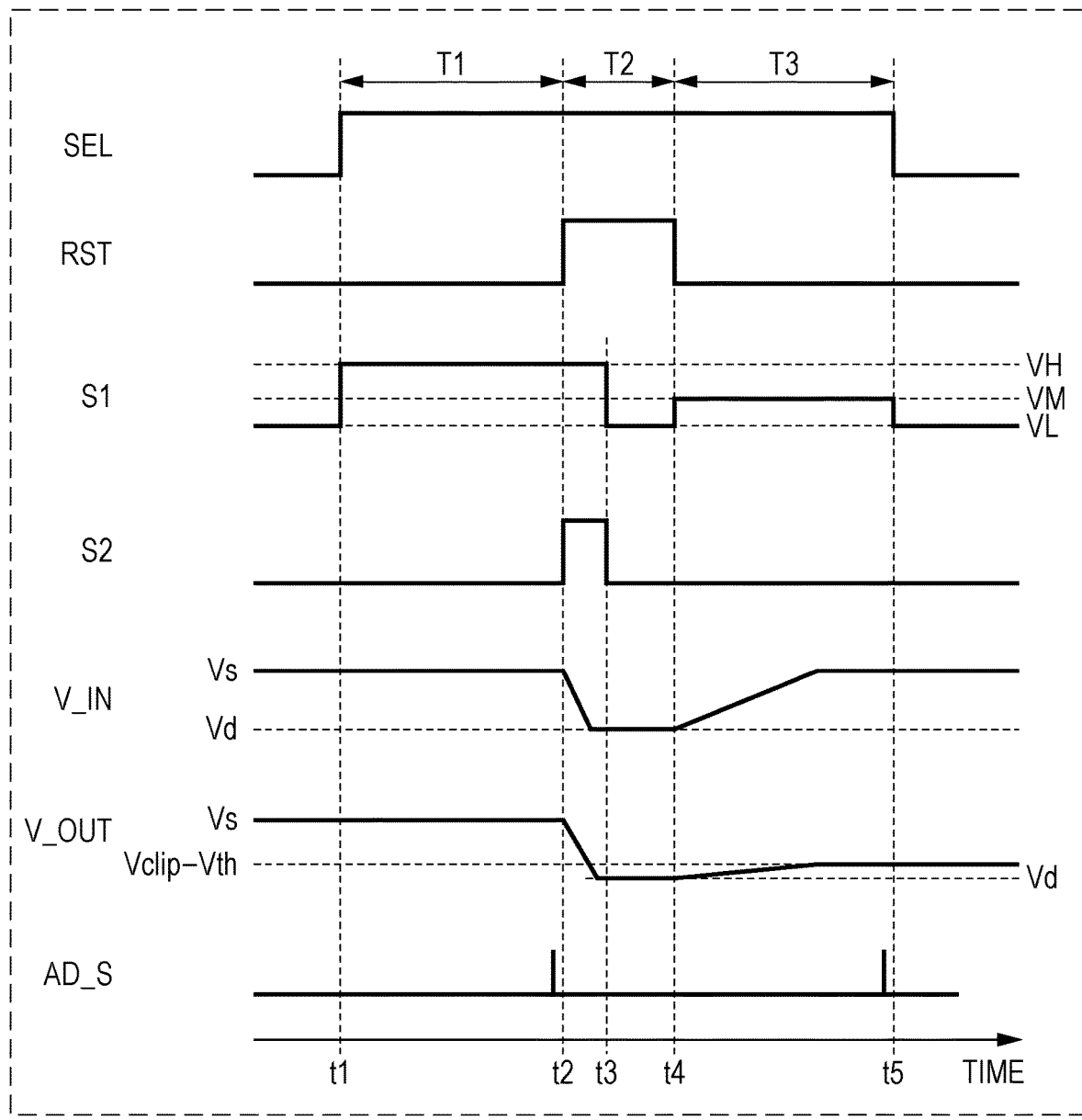
FIG. 10 is a chart illustrating operation timing of the imaging device according to the modification of the first embodiment.

FIG. 10 is a chart illustrating operation timing of the imaging device 200C according to the modification of the first embodiment. An operation illustrated in FIG. 10 is different from the operation illustrated in FIG. 6 in waveforms of the control signals S1 and S2.

More specifically, at the time t2 in the reset period T2, the control signal S2 changes to high level while the control signal S1 is kept at high level. This turns on the reset switch 212 while a V_IN node and a V_OUT node are electrically continuous with each other. Thus, signal charges accumulated in the parasitic capacitance Cp for the V_OUT node can be reset via the first transistor 211. At the same time, signal charges accumulated in a parasitic capacitance for the output signal line 102 can be reset. This has the effect of speeding up response of the output signal line 102 when the FD node 101 changes. After that, at the time t3, the control signal S1 and the control signal S2 are turned off. An operation after the time t3 is the same as that in FIG. 6.

Second Embodiment

Figure 11:
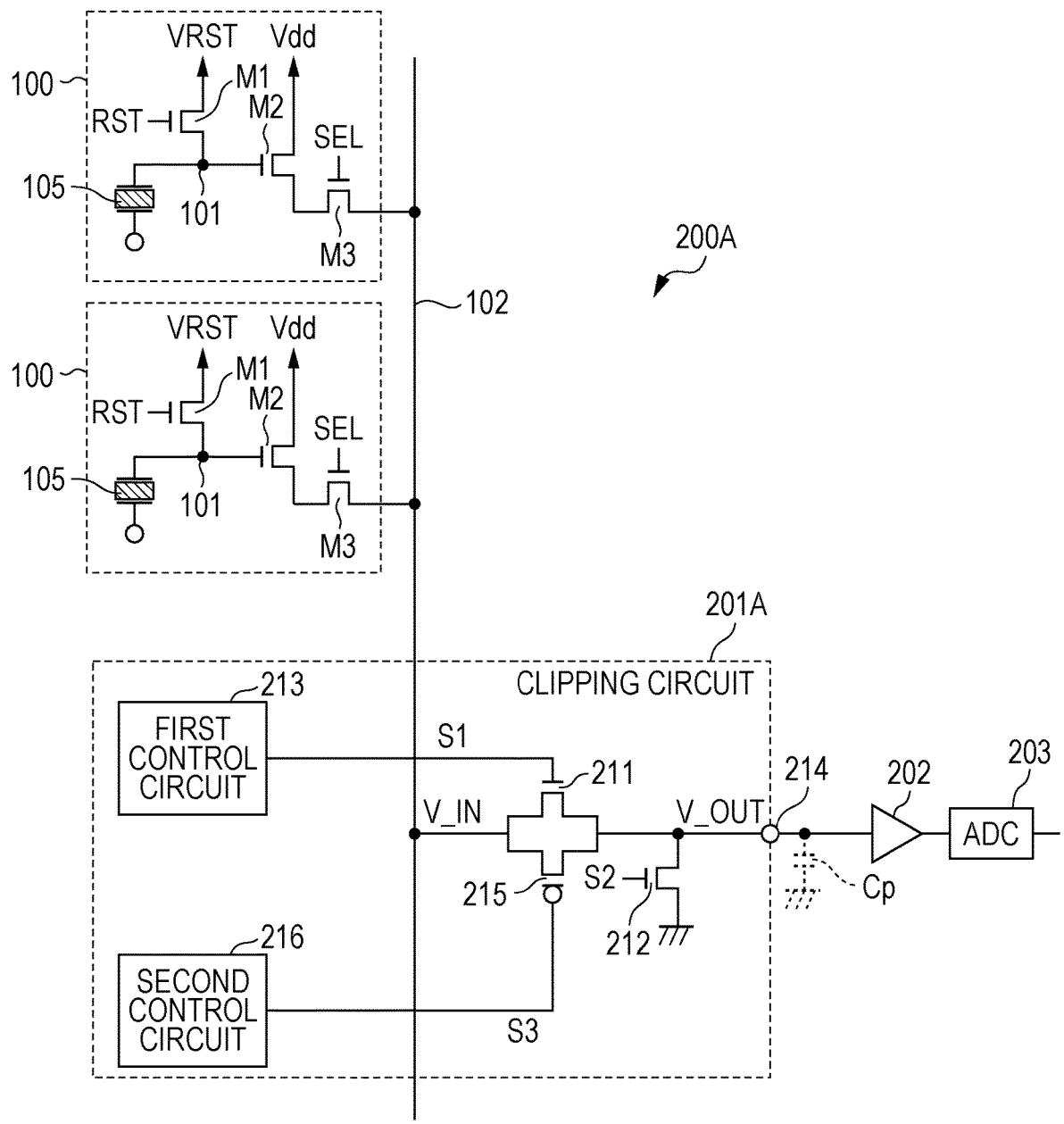
FIG. 11 is a diagram illustrating a circuit configuration of an imaging device according to a second embodiment.

FIG. 11 is a diagram illustrating a configuration of an imaging device 200A according to a second embodiment. The imaging device 200A illustrated in FIG. 11 is different from the imaging device 200 according to the first embodiment in that the imaging device 200A further includes a third transistor 215 and a second control circuit 216.

The third transistor 215 is connected in parallel with a first transistor 211. The second control circuit 216 is connected to a gate of the third transistor 215, generates a binary control signal S3, and applies the control signal S3 to the gate of the third transistor 215.

Note that an example where the first transistor 211 is an NMOS transistor (i.e., n-type transistor) and the third transistor 215 is a PMOS transistor (i.e., p-type transistor) will be described here. The first transistor 211 may be a PMOS transistor, and the third transistor 215 may be an NMOS transistor.

Figure 12:
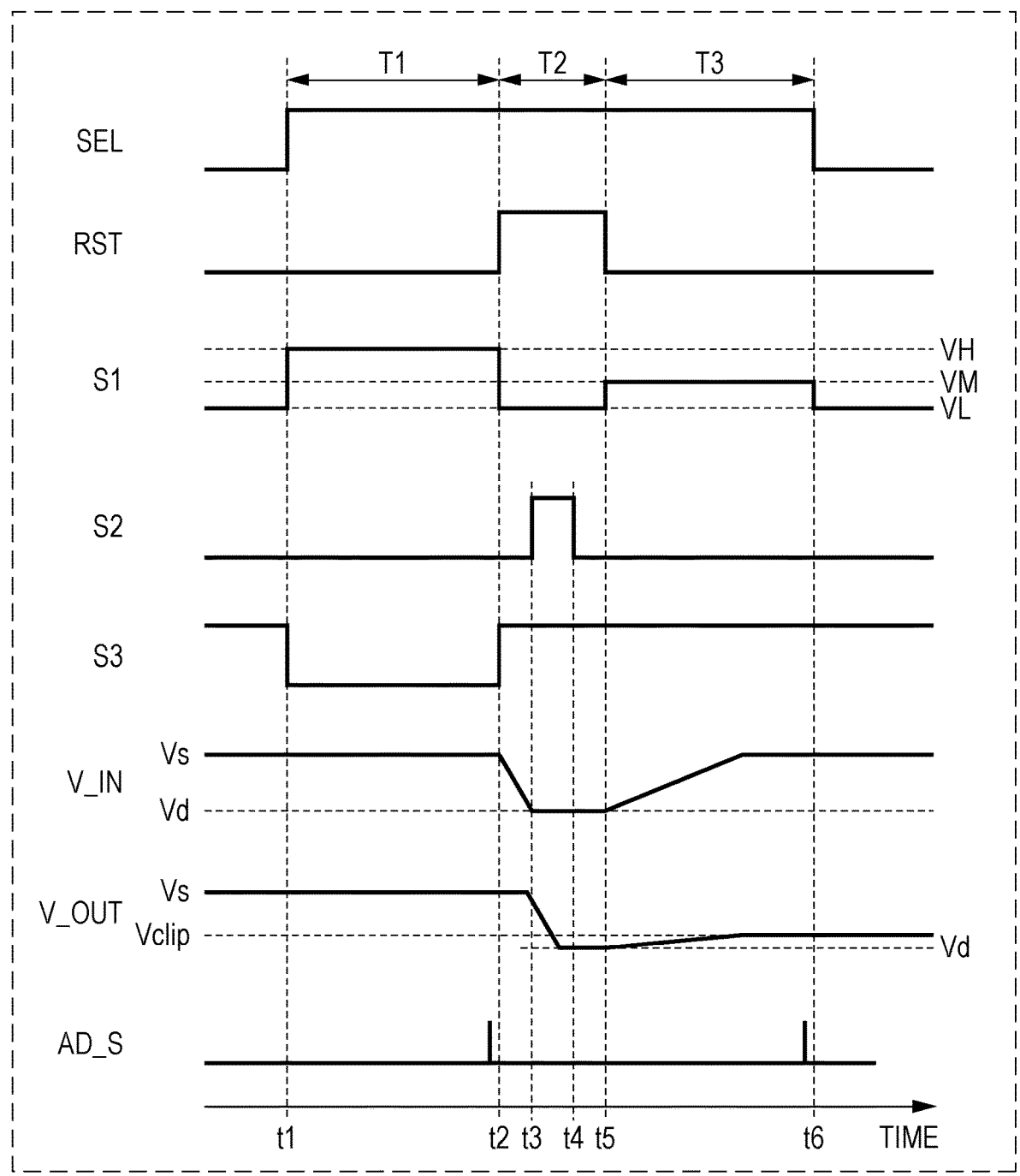
FIG. 12 is a chart illustrating operation timing of the imaging device according to the second embodiment.

FIG. 12 is a chart illustrating operation timing of the imaging device 200A according to the second embodiment. FIG. 12 is different from FIG. 6 according to the first embodiment in that the control signal S3 is added.

At a time t1 in a pixel signal read period T1, the control signal S3 changes to low level to turn on the third transistor 215. At a time t2 in a reset period T2, the control signal S3 changes to high level to turn off the third transistor 215. That is, the third transistor 215 is on in the pixel signal read period T1 and is off in the reset period T2 and a reference signal read period T3.

For this reason, in the pixel signal read period T1, the first transistor 211 and the third transistor 215 are both on. Thus, a clipping circuit 201A can linearly output a pixel signal within a wider voltage range than the clipping circuit 201 according to the first embodiment. More specifically, in the first embodiment, a pixel signal can be linearly output within the voltage range of 0 to Vdd−Vth. In contrast, in the second embodiment, a pixel signal can be linearly output within the voltage range of 0 to Vdd. Additionally, since on-resistances of both the first transistor 211 that is an NMOS transistor and the third transistor 215 that is a PMOS transistor can be reduced by turning on the both transistors, a response characteristic of the clipping circuit 201A can be improved. An on-resistance of an NMOS transistor is high within a range with a high source-to-gate voltage, and an on-resistance of a PMOS transistor is high within a range with a low source-to-gate voltage. Thus, connection of the both transistors in parallel allows reduction in a combined resistance of both the transistors within a wide source-to-gate voltage range.

In the reference signal read period T3, the third transistor 215 is off. As in the first embodiment, the first transistor 211 can clip an output voltage, and appearance of blocked up shadows can be inhibited.

Figure 13:
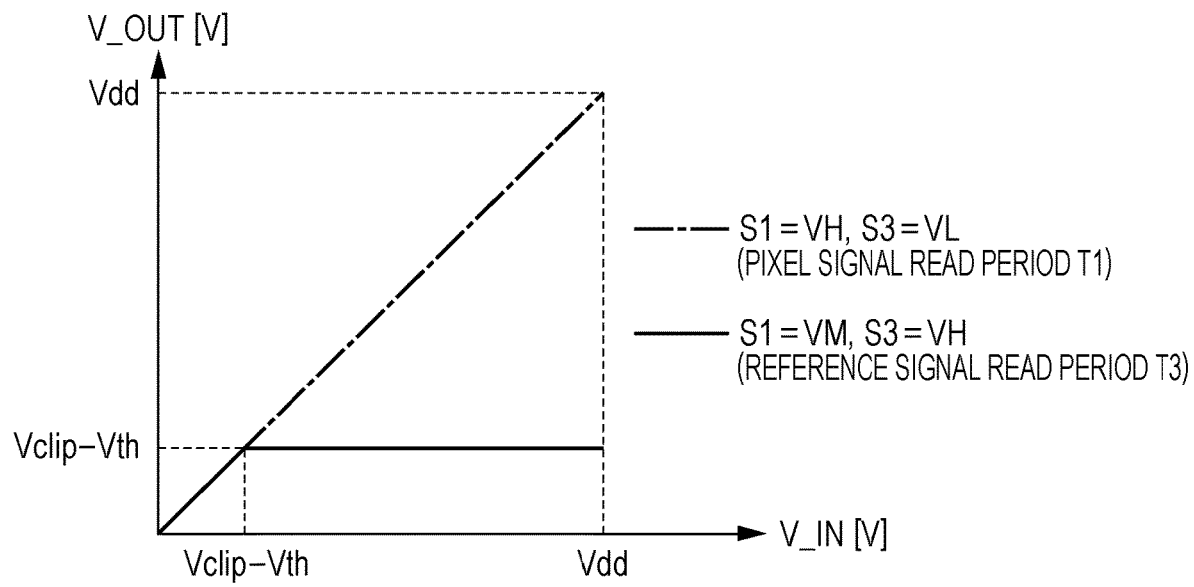
FIG. 13 is a graph illustrating an input-output characteristic of a clipping circuit according to the second embodiment.

FIG. 13 is a graph illustrating an input-output characteristic of the clipping circuit 201A according to the second embodiment. The abscissa in FIG. 13 indicates an input voltage V_IN while the ordinate indicates an output voltage V_OUT. The alternate long and short dash line indicates an input-output characteristic of the clipping circuit 201A in the pixel signal read period T1 when the control signal S1 is at high level (VH), and the control signal S3 is at low level (VL). The solid line indicates an input-output characteristic of the clipping circuit 201A in the reference signal read period T3 when the control signal S1 is at intermediate level (VM), and the control signal S3 is at high level (VH). By way of example, a graph when VH=Vdd, and 0<VM=Vclip<Vdd is illustrated here.

As illustrated in FIG. 13, in the pixel signal read period T1, the input-output characteristic varies linearly within the range 0≤V_OUT≤Vdd. In contrast, in the reference signal read period T3, the input-output characteristic varies linearly within the range 0≤V_OUT≤Vclip−Vth, as in the first embodiment.

Figure 14:
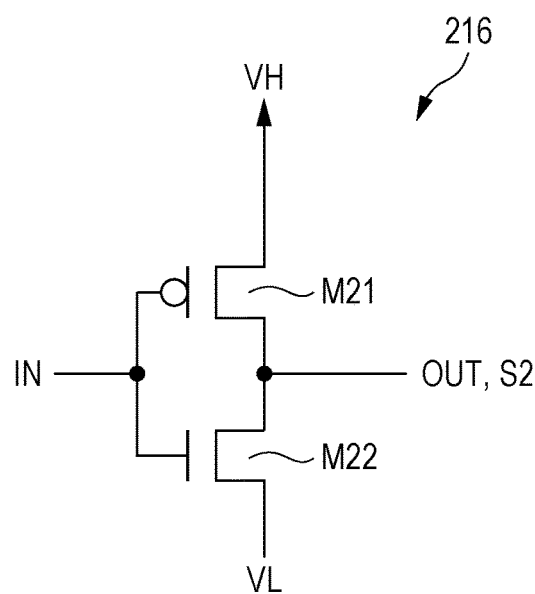
FIG. 14 is a diagram illustrating an example of a circuit configuration of a second control circuit according to the second embodiment.

FIG. 14 is a diagram illustrating an example of the second control circuit 216. The second control circuit 216 includes transistors M21 and M22. A gate of the transistor M21 is connected to a pulse input terminal IN, the voltage VH is applied to a source, and a drain is connected to an output terminal OUT. A gate of the transistor M22 is connected to the pulse input terminal IN, the voltage VL is applied to a source, and a drain is connected to the output terminal OUT.

By switching a signal from the pulse input terminal IN, the voltage VL or the voltage VH is output to the output terminal OUT. As described above, the second control circuit 216 can output a voltage with two possible values, VL and VH.

Note that the third transistor 215 may be of the same conductivity type as the first transistor 211. That is, the first transistor 211 and the third transistor 215 may be both NMOS transistors. Even in this case, the on-resistances can be reduced by turning on both the first transistor 211 and the third transistor 215 in the pixel signal read period T1. This is because on-resistance is inversely proportional to transistor size, and the first transistor 211 and the third transistor 215 that are connected in parallel and are simultaneously turned on can be regarded as equivalent to one larger-size transistor. In this case, it is desirable that current be fed more easily to the third transistor 215 than to the first transistor 211. For example, the third transistor 215 may be wider in gate width than the first transistor 211. Alternatively, the third transistor 215 may be lower in threshold voltage than the first transistor 211. Alternatively, a high-level voltage value for the control signal S3 to be applied to the gate of the third transistor 215 may be higher than a high-level voltage value for the control signal S1 to be applied to the gate of the first transistor 211.

Third Embodiment

A case where a photodiode is used as a photoelectric converter will be described in the present embodiment.

Figure 15:
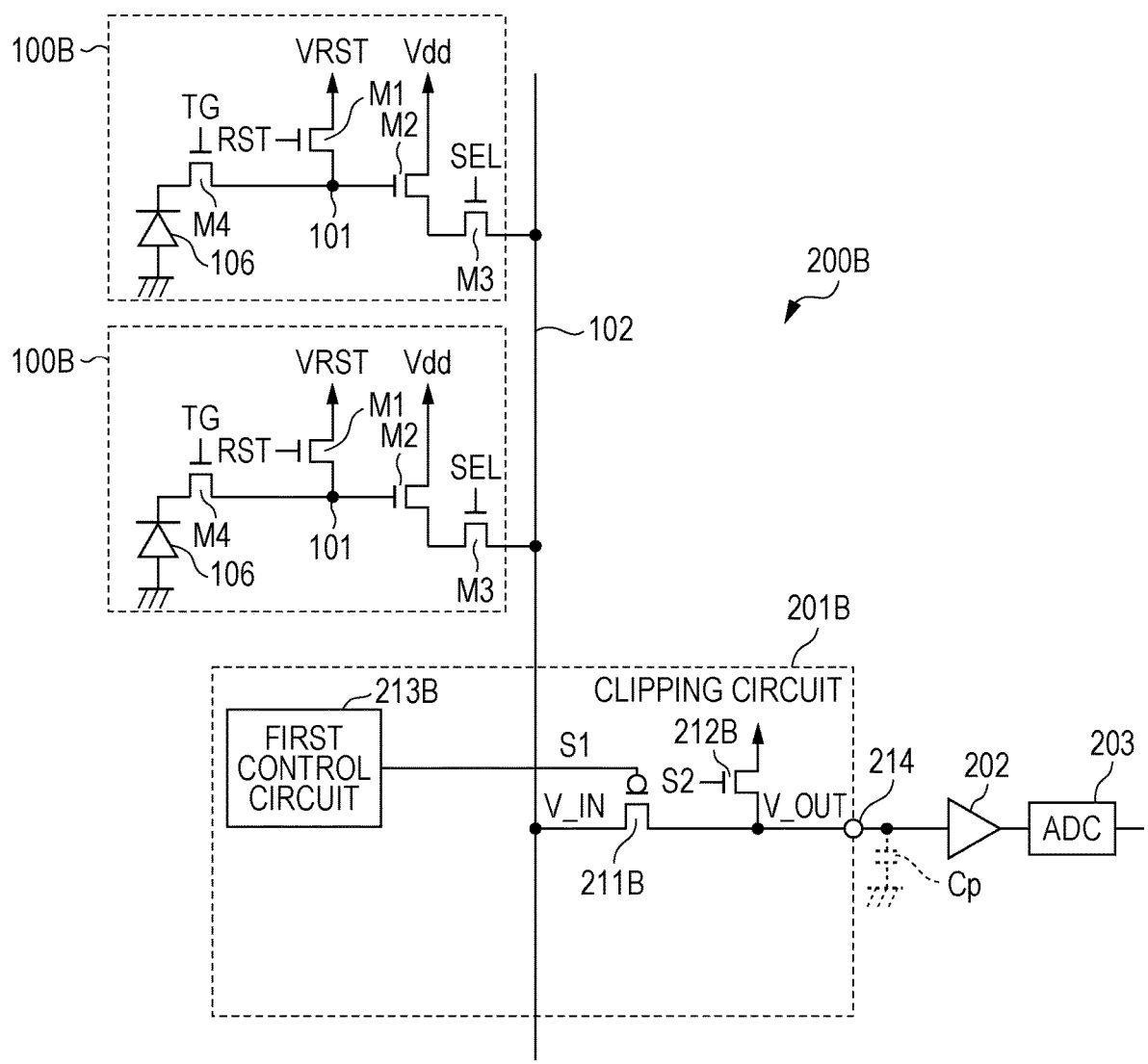
FIG. 15 is a diagram illustrating a circuit configuration of an imaging device according to a third embodiment.

FIG. 15 is a diagram schematically illustrating an example of a circuit configuration of an imaging device 200B according to a third embodiment. The imaging device 200B illustrated in FIG. 15 is different from the imaging device 200 illustrated in FIG. 5 in that a pixel 100B is different in configuration from the pixel 100. The clipping circuit 201B is different in configuration from the clipping circuit 201.

The pixel 100B is different from the pixel 100 in that the pixel 100B includes a photodiode 106 instead of the photoelectric converter 105. The pixel 100B further includes a transfer transistor M4.

The transfer transistor M4 is connected between the photodiode 106 and a FD node 101. An on-off state of the transfer transistor M4 is controlled by a control signal TG which is applied to a gate. The use of the transfer transistor M4 makes it possible to fully transfer signal charges from the photodiode 106 to the FD node 101.

The clipping circuit 201B includes a first transistor 211B, a reset switch 212B, and a first control circuit 213B. Although the first transistor 211 is an NMOS transistor in the first embodiment, the first transistor 211B is a PMOS transistor in the present embodiment. Additionally, although, for example, a ground voltage is applied to the other of the source and the drain of the reset switch 212 in the first embodiment, a power supply voltage or a reference voltage close to the power supply voltage is applied to the other of a source and a drain of the reset switch 212B in the present embodiment. In the following description, a signal charge is an electron. Note that a fixed potential to be applied to the other of the source and the drain of the reset switch 212B may be, for example, a reference potential VRST or a potential close to the reference potential VRST. The reference potential VRST according to the present embodiment is a potential closer to the power supply voltage than a ground potential. This allows reduction in the time required to charge or discharge a parasitic capacitance Cp.

Figure 16:
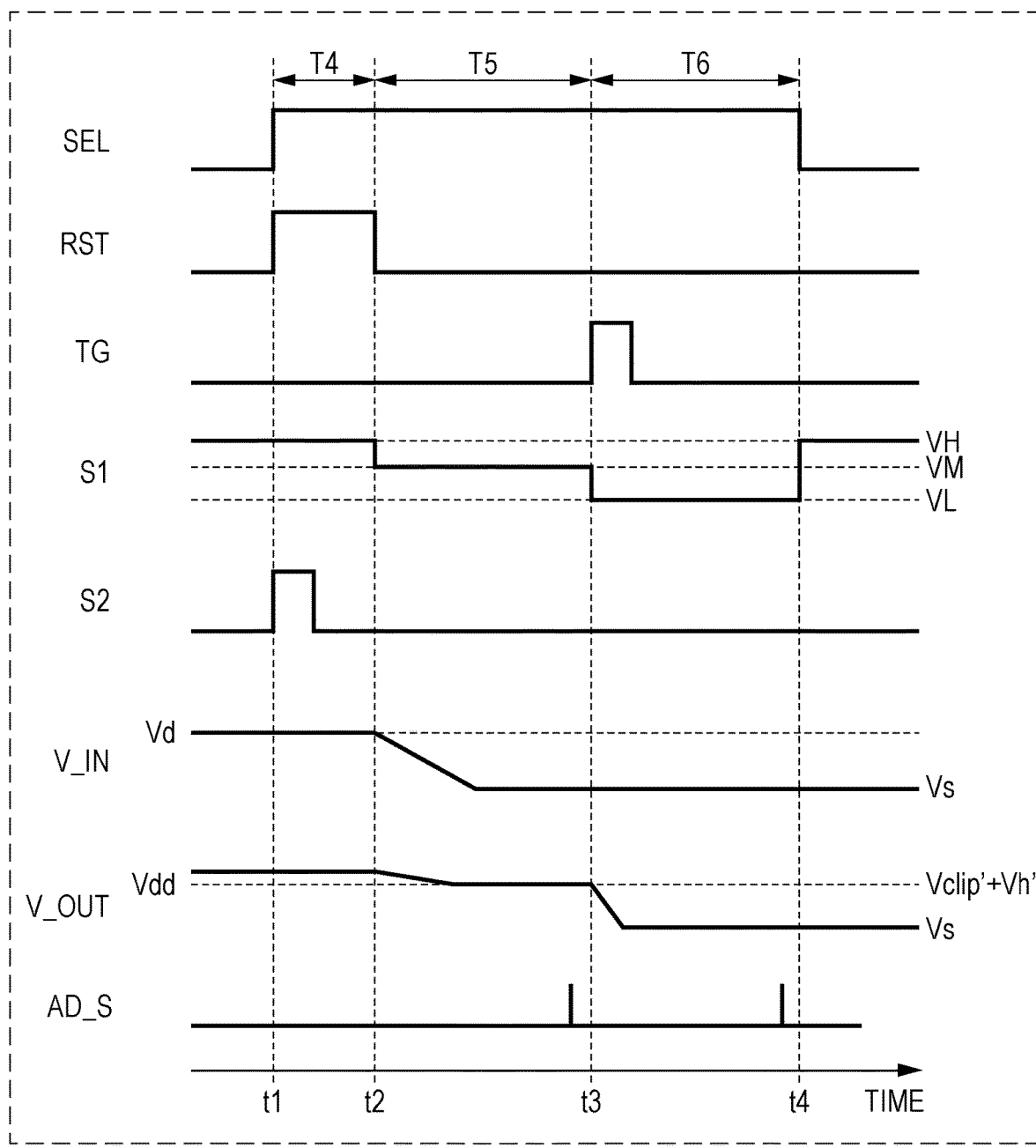
FIG. 16 is a chart illustrating operation timing of the imaging device according to the third embodiment.

FIG. 16 is a chart illustrating an example of operation timing according to the third embodiment at the time of imaging of a high-brightness subject. An operation is different in waveforms of a control signal RST, the control signal TG for the transfer transistor M4, a control signal S1, a control signal S2, a voltage V_IN, a voltage V_OUT, and a sampling signal AD_S in an AD conversion circuit 203 from the operation according to the first embodiment illustrated in FIG. 6.

In the first embodiment, pixel signal reading (the period T1), resetting (the period T2), and reference signal reading (the period T3) are performed in this order. In the present embodiment, resetting (a period T4), reference signal reading (a period T5), and pixel signal reading (a period T6) are performed in this order.

(Reset Period T4)

At a time t1, a control signal SEL changes to high level to turn on a selection transistor M3. The control signal RST changes to high level to turn on a reset transistor M1. This resets a potential at the FD node 101 to the reference potential VRST. The control signal S1 is at high level (VH), and the first transistor 211B is off. The voltage VH is set at, for example, the power supply voltage. At the time t1, the control signal S2 changes to high level to turn on the reset switch 212B. This resets a V_OUT node. In the example illustrated in FIG. 16, the V_OUT node is reset to a power supply voltage Vdd. After that, the control signal S2 changes to low level to turn off the reset switch 212B.

(Reference Signal Read Period T5)

At a time t2, the control signal RST changes to low level to turn off the reset transistor M1. In the case of imaging in a normal level of light, the FD node 101 is kept at VRST. In the case of imaging of a high-brightness subject, however, a large amount of electrons may be generated at the photodiode 106 to cause charges to flow into the FD node 101. For this reason, an output signal line 102 can decrease to a signal voltage Vs which is a voltage level for a saturated signal. Thus, a voltage at the output signal line 102 is a reference voltage Vd represented by Expression (8). In Expression (8), ΔVPC is a pixel signal voltage corresponding to the amount of charges generated by photoelectric conversion, and Vth0 is a threshold voltage of the amplification transistor M2.

$$Vd = Gsfx(VRST - \Delta VPC - Vth0) \quad (8)$$

The control signal S1 changes to intermediate voltage level (VM). This clips the output voltage V_OUT.

Figure 17:
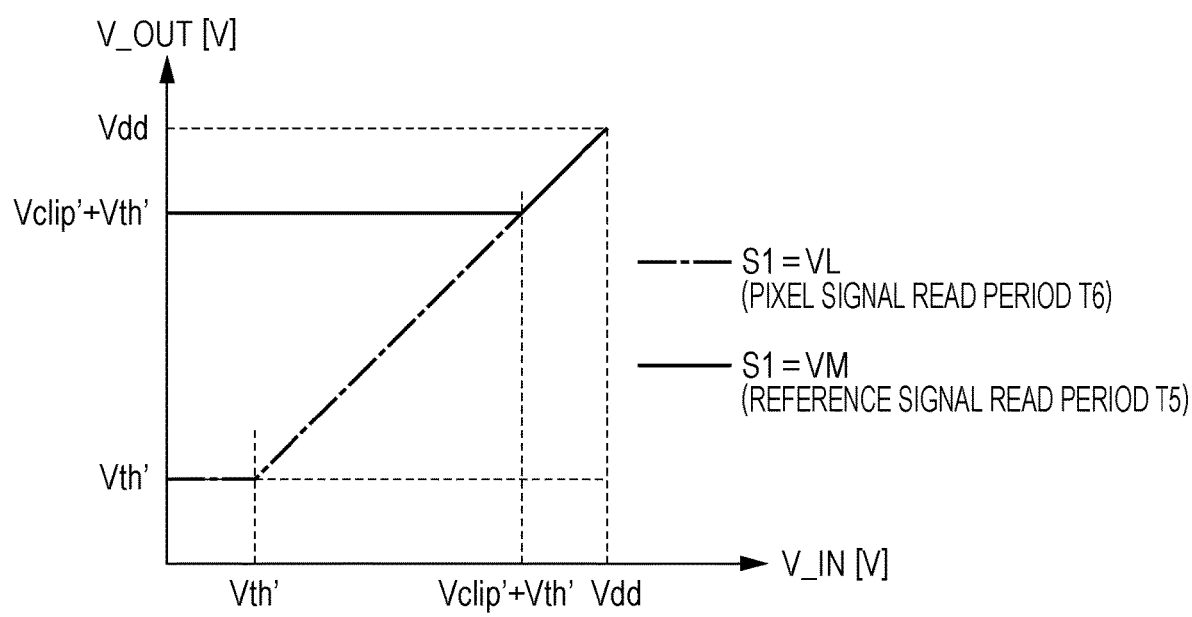
FIG. 17 is a graph illustrating an input-output characteristic of a clipping circuit according to the third embodiment.

FIG. 17 is a graph illustrating an input-output characteristic of the first transistor 211B. The abscissa in FIG. 17 indicates the input voltage V_IN while the ordinate indicates the output voltage V_OUT. The alternate long and short dash line indicates an input-output characteristic of the first transistor 211B when the control signal S1 is at low level (VL). The solid line indicates an input-output characteristic of the first transistor 211B when the control signal S1 is at intermediate level (VM). By way of example, a graph when VL=0, and 0<VM=Vclip'<Vdd−Vth' is illustrated here. Vth' here denotes a threshold voltage of the first transistor 211B.

If the control signal S1 is at VL, the input-output characteristic varies linearly within the range Vth'≤V_OUT≤Vdd. More specifically, V_OUT=V_IN holds within the range Vth'≤V_IN≤Vdd while V_OUT=Vth' holds within the range V_IN<Vth'.

If the control signal S1 is at VM, the input-output characteristic varies linearly within the range Vclip'+Vth'≤V_OUT≤Vdd. More specifically, V_OUT=V_IN holds within the range Vclip'+Vth'≤V_IN≤Vdd while V_OUT=Vclip'+Vth' holds within the range V_IN<Vclip'+Vth'.

Thus, an output voltage from the clipping circuit 201B is represented by Expression (9) below:

$$Vd = V\_OUT = Vclip' + Vth' \quad (9)$$

(Pixel Signal Read Period T6)

At a time t3, the control signal TG changes to high level to turn on the transfer transistor M4. With this turn-on, signal charges generated at the photodiode 106 are transferred to the FD node 101. The voltage at the output signal line 102 at this time is the signal voltage Vs represented by Expression (10):

$$Vs = Gsf \times (VRST - \Delta VPC\_MAX - Vth0) \quad (10)$$

The control signal S1 is at low level (VL) to turn on the first transistor 211B. The voltage VL is set at, for example, a ground voltage. With this turn-on, the signal voltage Vs is input to the AD conversion circuit 203 via an output terminal 214 and a column amplifier 202.

The imaging device 200B takes a difference between the signal voltage Vs and the reference voltage Vd. With this operation, a differential voltage Vpix is obtained. The differential voltage Vpix is represented by Expression (11). As seen from Expressions (9) and (10), the differential voltage Vpix can take a value other than zero. Thus, appearance of blocked up shadows can be inhibited.

$$V\text{pix} = Vs - Vd = Gsf \times (VRST + \Delta VPC\_MAX - Vth0) - (V\text{clip}' + Vth') \quad (11)$$

Note that although an example where the voltage VL is the ground voltage has been illustrated above, the voltage VL may be a voltage lower than the ground voltage. This allows expansion of an output voltage range for the clipping circuit 201B in the pixel signal read period T6. More specifically, the clipping circuit 201B can output a voltage less than Vth'.

Similar control may be performed using a third transistor 215 which is connected in parallel with the first transistor 211B, as in the second embodiment. In this case, the third transistor 215 is, for example, an NMOS transistor.

Alternatively, the third transistor 215 may be of the same conductivity type as the first transistor 211B. That is, the first transistor 211B and the third transistor 215 may be both PMOS transistors. In this case, as in the second embodiment, it is desirable that current be fed more easily to the third transistor 215 than to the first transistor 211B.

Note that although an example which calculates a difference between a reference signal and a pixel signal before AD conversion is illustrated here, the AD conversion circuit 203 may perform AD conversion of each of the reference signal and the pixel signal and calculate a difference between the reference signal and the pixel signal after the AD conversion.

In the above-described case, at a time when the sampling signal AD_S illustrated in FIG. 16 changes to high level, the AD conversion circuit 203 samples a voltage at the output terminal 214 and performs AD conversion of each sample. That is, the AD conversion circuit 203 performs AD conversion of the reference voltage Vd immediately before the time t3. The AD conversion circuit 203 performs AD conversion of the signal voltage Vs immediately before a time t4.

The imaging devices according to the embodiments of the present disclosure have been described above. The present disclosure, however, is not limited to the embodiments.

For example, division into functional blocks in a block diagram is merely illustrative. A plurality of functional blocks may be implemented as one functional block, one functional block may be divided into a plurality of functional blocks, or some functions of a functional block may be transplanted to another functional block.

The processing units included in the apparatuses according to the above-described embodiments are typically implemented as LSIs which are integrated circuits. The processing units may be formed into separate chips or one chip may be formed so as to include some or all of the processing units.

The method for circuit integration is not limited to LSIs, and implementation using dedicated circuits or general-purpose processors is also possible. A field programmable gate array (FPGA) which is programmable after LSI manufacture or a reconfigurable processor in which connections and settings of circuit cells within an LSI can be reconfigured may be used.

In each of the embodiments, one or ones of the components may be implemented through execution of a software program appropriate for the one or ones. A component may be implemented when a program executer, such as a CPU or a processor, reads out and executes a software program recorded on a recording medium, such as a hard disk or a semiconductor memory.

If a certain element is expressed as being connected to a different element in the present specification, a third element may intervene between the elements. If a certain element is expressed as being directly connected to a different element, the expression means that no third element intervenes between the elements. Additionally, if a certain element is expressed as being electrically connected to a different element, the expression means that the elements need not be always electrically connected and are electrically connected at least at a certain time point.

An imaging device according to the present disclosure can be applied to various camera systems and sensor systems, such as a digital still camera, a camera for medical use, a monitoring camera, an in-car camera, a digital single-lens reflex camera, and a digital mirrorless interchangeable lens camera.

What is claimed is:

1. An imaging device comprising:
    a pixel that outputs a pixel signal corresponding to an amount of incident light;
    an output signal line that is connected to the pixel to allow the pixel signal from the pixel to be output to the output signal line;
    a first transistor that has a first gate, a first source, and a first drain, one of the first source and the first drain being connected to the output signal line to allow the pixel signal to be output from the output signal line; and
    a first circuit that is connected to the first gate, the first circuit being configured to generate a third voltage that is a voltage between a first voltage and a second voltage, the first voltage being a voltage for turning on the first transistor, the second voltage being a voltage for turning off the first transistor.

2. The imaging device according to claim 1, further comprising: a second transistor that has a second gate, a second source, and a second drain, one of the second source and the second drain being connected to either the first source or the first drain, a fourth voltage being applied to the other of the second source and the second drain.

3. The imaging device according to claim 1, wherein the first circuit is configured to generate the first voltage, and
    the first circuit
        applies the first voltage to the first gate in a first period, and
        applies the third voltage to the first gate in a second period different from the first period.

4. The imaging device according to claim 3, wherein the pixel
    outputs the pixel signal to the output signal line in the first period, and
    outputs a reference signal after resetting to the output signal line in the second period.

5. The imaging device according to claim 3, further comprising:
- a third transistor that has a third gate, a third source, and a third drain, one of the third source and the third drain being connected to the one of the first source and the first drain, the other of the third source and the third drain being connected to the other of the first source and the first drain; and
- a second circuit that is connected to the third gate.

6. The imaging device according to claim 5, wherein
the second circuit is configured to generate a fourth voltage for turning on the third transistor and a fifth voltage for turning off the third transistor, and
the second circuit
- applies the fourth voltage to the third gate in the first period, and
- applies the fifth voltage to the third gate in the second period.

7. The imaging device according to claim 5, wherein
the first transistor is an n-type transistor, and
the third transistor is a p-type transistor.

8. The imaging device according to claim 5, wherein
the first transistor is a p-type transistor, and
the third transistor is an n-type transistor.

9. The imaging device according to claim 5, wherein a conductivity type of the first transistor is the same as a conductivity type of the third transistor.

10. The imaging device according to claim 9, wherein a gate width of the first transistor is less than a gate width of the third transistor.

11. The imaging device according to claim 3, wherein
the first voltage is a power supply voltage, and
the second voltage is a ground voltage.

12. The imaging device according to claim 3, wherein
the first voltage is a ground voltage, and
the second voltage is a power supply voltage.

13. The imaging device according to claim 11, wherein the third voltage is a voltage between the power supply voltage and the ground voltage.

14. The imaging device according to claim 3, wherein
the first voltage is greater than a power supply voltage, and
the second voltage is a ground voltage.

15. The imaging device according to claim 3, wherein
the first voltage is less than a ground voltage, and
the second voltage is a power supply voltage.

16. The imaging device according to claim 1, wherein a width of a first input voltage range is less than a width of a second input voltage range, the first transistor indicating a linear input-output characteristic within the first input voltage range when the third voltage is applied to the first gate, the first transistor indicating a linear input-output characteristic within the second input voltage range when the first voltage is applied to the first gate.

* * * * *